United States Patent [19]

Tamura et al.

[11] Patent Number: 4,615,829
[45] Date of Patent: Oct. 7, 1986

[54] ELECTROCONDUCTIVE ORGANIC POLYMER AND METHOD FOR PRODUCING THE SAME

[75] Inventors: Shohei Tamura, Tokyo; Sadamitsu Sasaki, Osaka; Masao Abe, Osaka; Hitoshi Nakazawa, Osaka; Hisashi Ichinose, Osaka; Keiji Nakamoto, Osaka; Satoshi Yumoto, Osaka, all of Japan

[73] Assignee: Nitto Electric Industrial Co., Ltd., Osaka, Japan

[21] Appl. No.: 671,155

[22] Filed: Nov. 13, 1984

[30] Foreign Application Priority Data

Nov. 10, 1983 [JP] Japan .................... 58-212280
Sep. 22, 1984 [JP] Japan .................... 59-198873

[51] Int. Cl.[4] ............................................. H01B 1/00
[52] U.S. Cl. ................................ 252/500; 252/518; 252/519; 524/80; 524/401; 524/422; 524/429; 524/435; 524/438; 528/422; 528/486; 528/487; 528/490
[58] Field of Search ............... 252/500, 518, 519; 524/80, 401, 157, 158, 284, 435, 431, 429, 438, 419, 422; 528/422, 486, 487, 490

[56] References Cited

U.S. PATENT DOCUMENTS

| | | | |
|---|---|---|---|
| 4,505,842 | 3/1985 | Kurkov et al. | 252/500 |
| 4,505,843 | 3/1985 | Suzuki et al. | 252/518 |
| 4,508,639 | 4/1985 | Camps et al. | 252/500 |
| 4,511,492 | 4/1985 | Swedo et al. | 252/500 |

OTHER PUBLICATIONS

*J. Polymer Science*, C., vol. 16, pp. 2931, 2943, (1967), R. Buvet et al.
*J. Amer. Chem. Soc.*; vol. 84, p. 3618 (1962); D. M. Mohilner et al.

Primary Examiner—Josephine L. Barr
Attorney, Agent, or Firm—Sughrue, Mion, Zinn, Macpeak, and Seas

[57] ABSTRACT

An electroconductive organic polymer exhibiting outstanding electroconductivity is described, containing an electron acceptor as a dopant, and having electroconductivity of not less than $10^{-6}$ S/cm, substantially comprising a linear polymer having as a main repeating unit thereof a quinonediimine structure represented by formula (III)

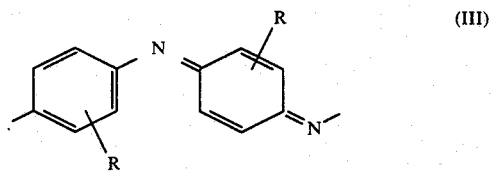

wherein R represents a hydrogen atom or an alkyl group. This polymer can be obtained by oxidative polymerization of an aniline compound or a water-soluble salt thereof with an oxidizing agent in a reaction medium containing a protonic acid.

8 Claims, 18 Drawing Figures

ELECTROCONDUCTIVE ORGANIC POLYMER AND METHOD FOR PRODUCING THE SAME

FIELD OF THE INVENTION

This invention relates to a novel electroconductive organic polymer and to a method for producing the same. More particularly, this invention relates to a novel electroconductive organic polymer obtained by the oxidative polymerization of an aniline compound or a water-soluble salt thereof and to a method for producing the same.

BACKGROUND OF THE INVENTION

Virtually all organic substances are electrically insulative. In recent years, however, certain groups of organic polymers possessing electroconductivity and known as organic semiconductors have been attracting growing attention. Generally, the organic substances which are electroconductive in themselves are classified into three types.

The first type of such electroconductive substance is graphite. Strictly speaking, graphite is not regarded as an organic substance. However, graphite may be considered to possess a structure where an organic conjugated system extends to a high degree. Graphite in its unmodified form already possesses fairly high electroconductivity. By intercalation of another compound, it is possible to provide enhanced electroconductivity, possibly even reaching the level of superconductivity. Graphite, however, is strongly two-dimensional, and is not easily fabricated into a desired shape. This fact prevents graphite from finding extensive utility in many applications.

The second type is charge-transfer complexes. The crystalline substance obtained by using, for example, tetrathifulvalene and tetracyanoquinodimethane, as an electron donor and an electron acceptor, respectively, possesses extremely high electroconductivity of 400 to 500 S/cm at room temperature. Since these charge-transfer complexes are not polymers, they are deficient in moldability, and, similarly to graphite, can not find utility in many practical applications.

The third type is $\pi$ electron conjugate type organic polymers, represented by polyacetylene, which can acquire high electroconductivity by doping. Before doping, polyacetylene of the trans form exhibits electroconductivity of $10^{-5}$ S/cm, and polyacetylene of the cis form exhibits electroconductivity of $10^{-9}$ S/cm; i.e., they possess properties approximating the properties of semiconductors or insulators. When these polyacetylenes are doped with an electron acceptor such as, for example, arsenic pentafluoride, iodine, sulfur trioxide, or ferric chloride or with an electron donor such as an alkali metal, they can form p-type semiconductors and n-type semiconductors, respectively. They can further acquire electroconductivity as high as $10^3$ S/cm. The above-described polyacetylenes are electroconductive organic polymers, interesting from the theoretical point of view. They are, however, highly susceptible to oxidation, so that, if left standing in the atmosphere, they are readily degraded by oxidation and seriously altered in quality. In the doped state, the polyacetylenes are more sensitive to oxidation, and decrease their electroconductivity sharply upon exposure to even a low degree of moisture in the air. This trend is particularly remarkable in the n-type semiconductors of polyacetylenes.

Poly(p-phenylene) and poly(p-phenylene sulfide), before doping, possess low degrees of electroconductivity, viz., $10^{-9}$ S/cm and $10^{-16}$ S/cm, respectively. When they are doped with, for example, arsenic pentafluoride, they are converted into electroconductive organic polymers possessing electroconductivities of 500 S/cm and 1 S/cm, respectively. The electric properties of such doped organic polymers are unstable, though, to varying degrees.

As described above, these doped electroconductive organic polymers generally possess extremely unstable electric properties under atmospheric exposure. This is a phenomenon common to electroconductive organic polymers of this class. This phenomenon has been a hindrance to the growth of use of such polymers in practical applications.

Various electroconductive organic substances have been known in the art as described above. With a view to ensuring growth of their utility in practical applications, such substances should desirably be provided in forms which are excellent in moldability.

On the other hand, research on the oxidative polymerization of aniline as an oxidation dye has long been under way regarding aniline black. Particularly, as an intermediate in the production of aniline black, the octamer of aniline represented by Formula (I) has been identified as emeraldine (A. G. Green et al., *J. Chem. Soc.*, Vol. 97, p. 2388 (1910); ibid, Vol. 101, p. 1117 (1912)). This octamer is soluble in 80% acetic acid, cold pyridine, and N,N-di-methylformamide.

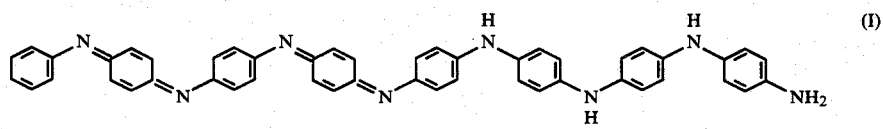

The emeraldine is oxidized in an ammoniacal medium to form nigraniline represented by Formula (II), which is also known to possess solubility similar to that of emeraldine.

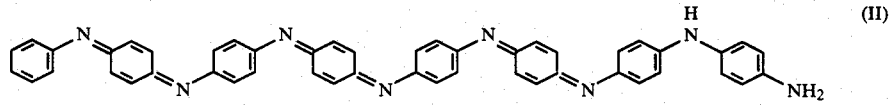

It has been demonstrated recently by R. Buvet et al. that the sulfate of emeraldine possesses high electroconductivity (*J. Polymer Sci.*, C, Vol. 16, pp. 2931, 2943 (1967); ibid, Vol. 22, p. 1187 (1969)).

It has been also demonstrated that an organic substance similar to emeraldine can be obtained by electrolytic oxidative polymerization of aniline (D. M. Mohilner et al., *J. Amer. Chem. Soc.*, Vol. 84, p. 3618 (1962)). According to this publication, a substance soluble in 80% acetic acid, in pyridine, and in N,N-dimethylformamide can be obtained when an aqueous sulfuric acid solution of aniline is subjected to electrolytic oxidative polymerization using a platinum electrode at an oxidation potential of +0.8 V relative to the standard calomel electrode, a level necessary for avoiding electrolysis of water.

In addition to the reports mentioned above, Diaz et al. (*J. Electroanal. Chem.*, Vol. 141, p. 141 (1980)) and Oyama et al. (Polymer Preprints, Japan, Vol. 30, No. 7, p. 1524 (1981); *J. Electroanal. Chem.*, Vol. 161, p. 399 (1984)) have also tried electrolytic oxidative polymerization of aniline. All these studies are aimed at polymer-coated chemically modified electrodes where the electrolysis is conducted at potentials not exceeding 1 V.

SUMMARY OF THE INVENTION

An object of this invention is, therefore, to provide a novel electroconductive organic polymer and a method for producing the same.

This and other objects of the present invention will become apparent to those skilled in the art in the following description of the invention and the accompanying drawings.

Based on extensive studies, especially on the oxidative polymerization of aniline for the purpose of developing stable organic materials possessing high electroconductivity, and particularly for electroconductive organic polymers, it has now been found that, by selecting the reaction conditions of the oxidative polymerization of aniline, a highly electroconductive polymer can be obtained, possessing a far higher molecular weight than the above-described emeraldine, and which exhibits stability without an additional doping step because it has already undergone doping during the course of the oxidative polymerization. This knowledge has led to the present invention.

The electroconductive organic polymer of the present invention contains an electron acceptor as a dopant, has electroconductivity of not less than $10^{-6}$ S/cm, and substantially comprises a linear polymer having as a main repeating unit thereof a quinonediimine structure represented by Formula (III)

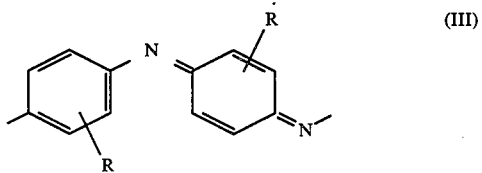

(III)

wherein R represents a hydrogen atom or an alkyl group.

In another aspect, the present invention is directed to a method for producing an electroconductive organic polymer comprising (1) oxidative polymerization of an aniline compound or a water-soluble salt thereof with an oxidizing agent in a reaction medium containing a protonic acid, or (2) electro-oxidative polymerization of an aniline compound or a water-soluble salt thereof in a solution containing a protonic acid in at least equimolar amount relative to the aniline compound in a solvent at an electrode potential higher than +1 V relative to the standard calomel electrode at a current density in the range of 0.01 mA/cm$^2$ to 1 A/cm$^2$

DETAILED DESCRIPTION OF THE INVENTION

The term "aniline compound" as used herein means aniline and an alkylaniline having 1 to 2 carbon atoms in the alkyl moiety.

The electroconductive oxidation polymer of an aniline compound according to the present invention generally has an appearance of a green to blackish green color in a dry powdery form. Generally, this green color gains in brightness as the degree of electroductivity increases. However, a shaped product of the polymer produced by compression molding has a glossy blue color.

The electroductive organic polymer of the present invention is insoluble in water and virtually all organic solvents but is normally soluble slightly or partially soluble in 97% sulfuric acid. The solubility of the polymer in concentrated sulfuric acid varies depending upon the method of the reaction and the conditions of the reaction used for the polymer formation. The electroconductive organic polymer obtained by oxidative polymerization of an aniline compound with a chemical oxidizing agent generally has a solubility in the range of from 0.2 to 10% by weight, in most cases, in the range of from 0.25 to 5% by weight. The term "solubility" as used herein, particularly with respect to polymer of high molecular weight, is to be interpreted to be such that polymer contains a portion having a solubility in the above-described range. The polymer thus sharply contrasts with emeraldine which is soluble, as described above, in 80% acetic acid, in cold pyridine, and in N,N-dimethylformamide.

The polymer of the present invention, when dissolved in 97% concentrated sulfuric acid at a concentration of 0.5 g/dl (gram/deciliter), possesses a logarithmic viscosity number in the range of from 0.1 to 1.0, and in most cases, in the range of from 0.2 to 0.6. The term "logarithmic viscosity number" as used herein, particularly with respect to polymer of high molecular weight, is to be interpreted so that the portion of the polymer soluble in concentrated sulfuric acid falls in the range described above. The logarithmic viscosity number ($\eta$ inh) is well known in the art and can be determined by the following formula:

$$\eta\ inh = \frac{\ln \frac{t}{t_o}}{C}$$

wherein:
"$t_o$" is a falling time (sec.) of a solvent alone determined by Ostwald's viscometer;
"t" is a falling time (sec.) of a polymer solution in the above solvent determined by Ostwald's viscometer;
"C" is a concentration of the above polymer solution (g/dl);
"ln" is natural logarithms.

For comparison, the logarithmic viscosity numbers of emeraldine and aniline black determined under the same conditions are, respectively, 0.02 to 0.005, signifying that the polymer of this invention has a high molecular weight. Further, the results of differential thermal analysis also indicate that the polymer of this invention is a polymer having high molecular weight.

Figure 1:
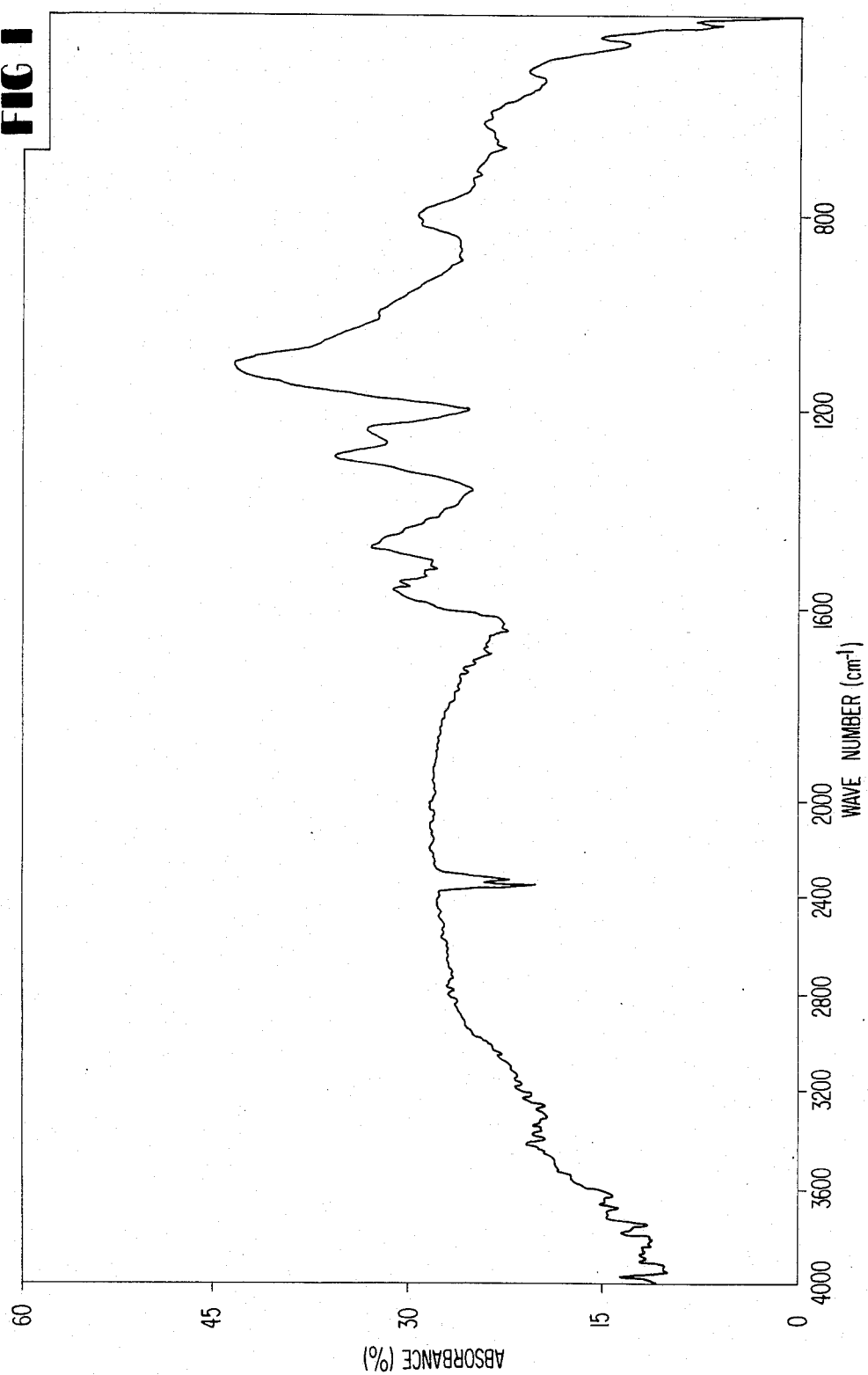
FIG. 1 is an infrared absorption spectrum of an electroconductive organic polymer produced by the present invention.
Figure 2:
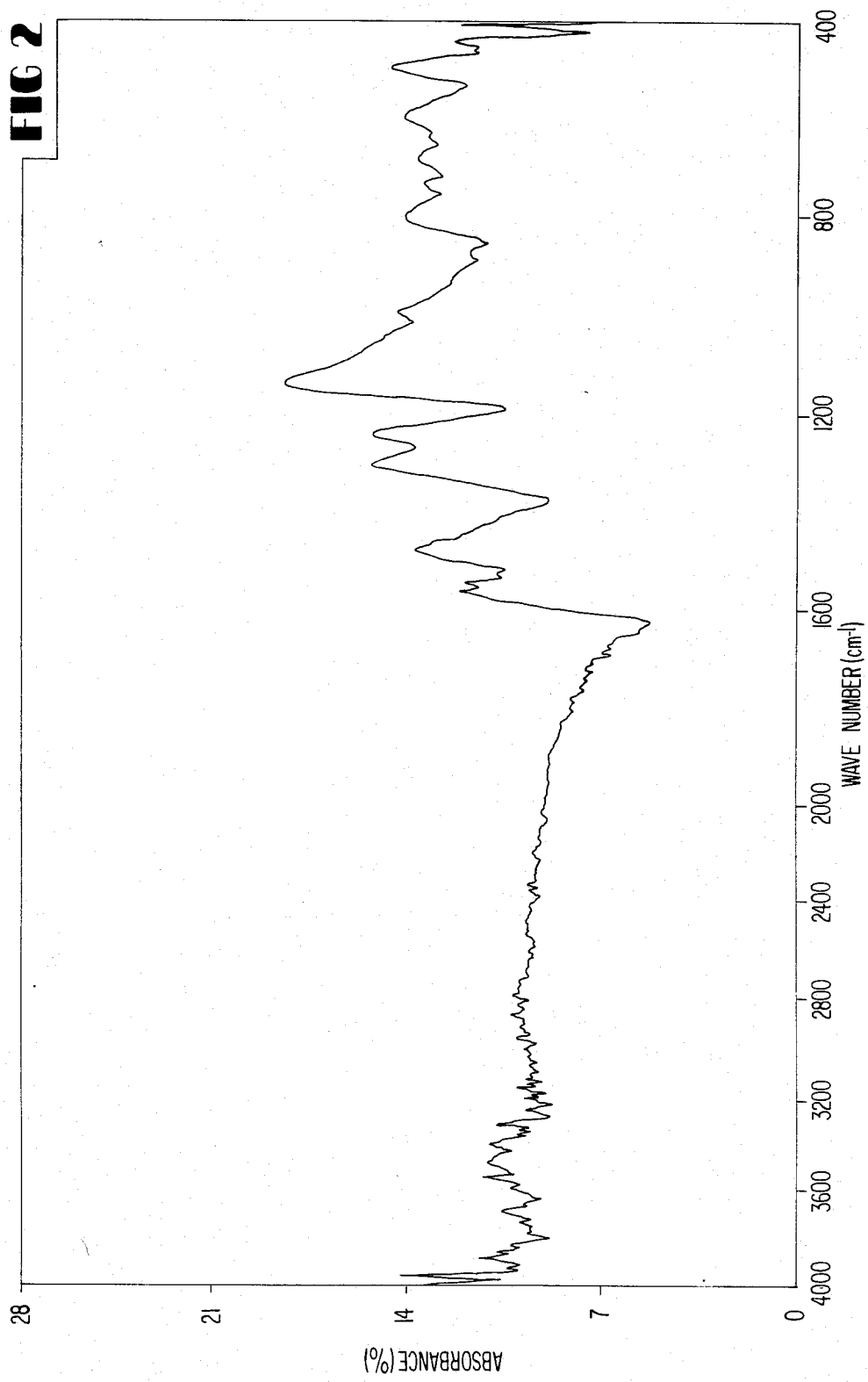
FIG. 2 and FIG. 3 are infrared absorption spectra of emeraldine and aniline black, respectively.
Figure 3:
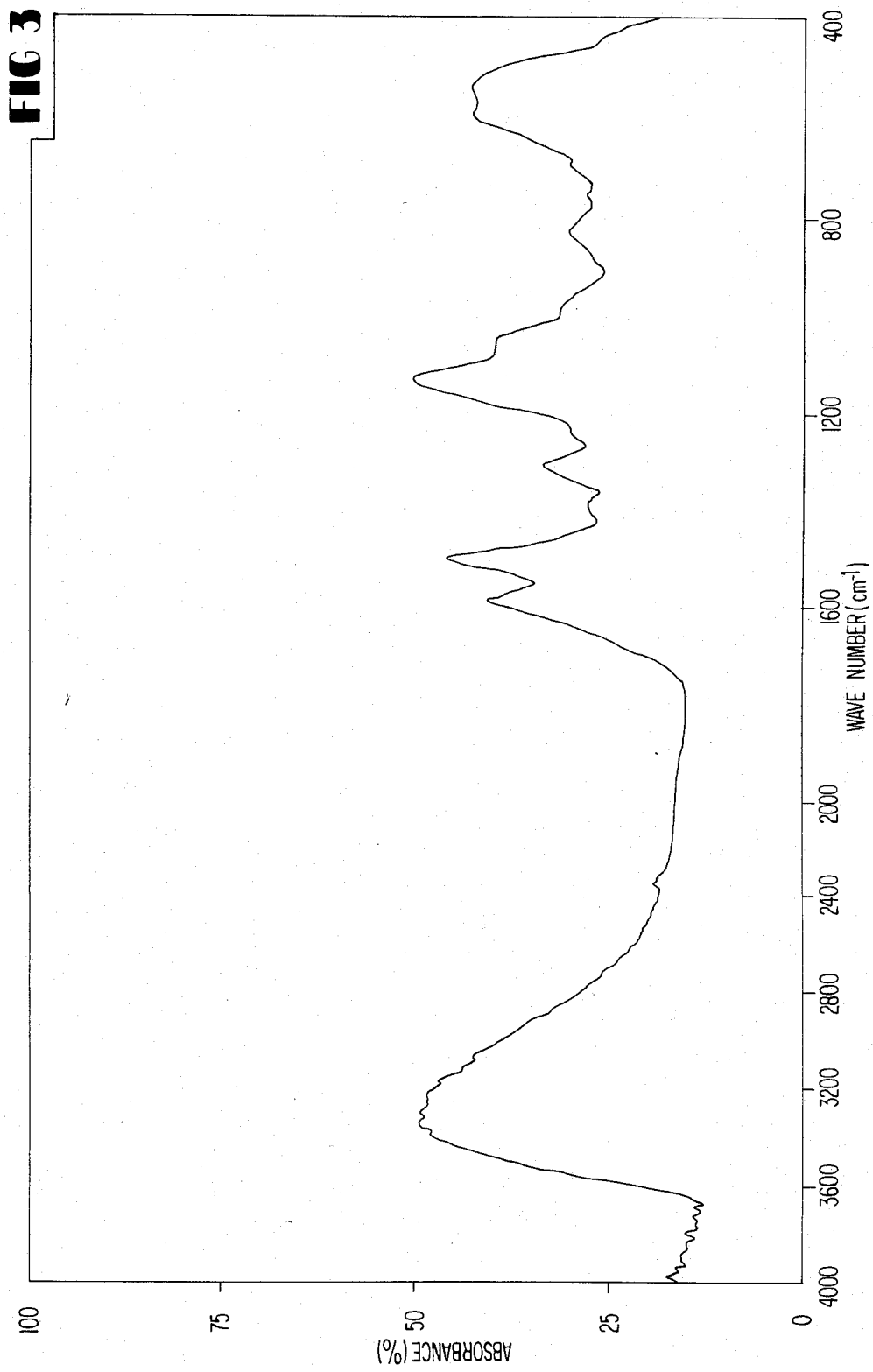

The infrared absorption spectrum obtained of an electroconductive polymer produced as a typical polymer of this invention by the oxidative polymerization of aniline is shown in FIG. 1. For comparison, the infrared absorption spectra obtained of emeraldine and aniline black (commercially available as pigment under designation of "Diamond Black") are shown respectively in FIG. 2 and FIG. 3.

The infrared absorption spectrum of the electroconductive polymer of this invention somewhat resembles that of emeraldine. However, in the infrared absorption spectrum of the polymer of this invention, the absorption due to the deformation vibration outside the C-H plane of a mono-substituted benzene clearly recognized in emeraldine is not substantially observed, and the absorption due to a para-substituted benzene is relatively high. The absorption spectrum of the polymer of the present invention differs widely from that of aniline black. The polymer of the present invention, accordingly, possesses somewhat emeraldine-like structure, containing a number of para-substituted benzene rings.

The polymer of this invention is doped with an electron acceptor which is present in the polymerization system during the course of the oxidative polymerization of an aniline compound. As a result, it possesses high electroconductivity. In this polymer, therefore, electron transfers from the polymer to the electron acceptor and a charge transfer complex is formed between the polymer and the electron acceptor. When the polymer of this invention is molded in the shape of a disk, for example, and a pair of electrodes are fixed on the disk and a temperature difference is produced between the electrodes to give rise to thermal electromotive force peculiar to a semiconductor, a positive electromotive force is generated on the electrode of low temperature side, and a negative electromotive force on the electrode of high temperature side. This fact indicates that the polymer produced by this invention is a p-type semiconductor.

Figure 4:
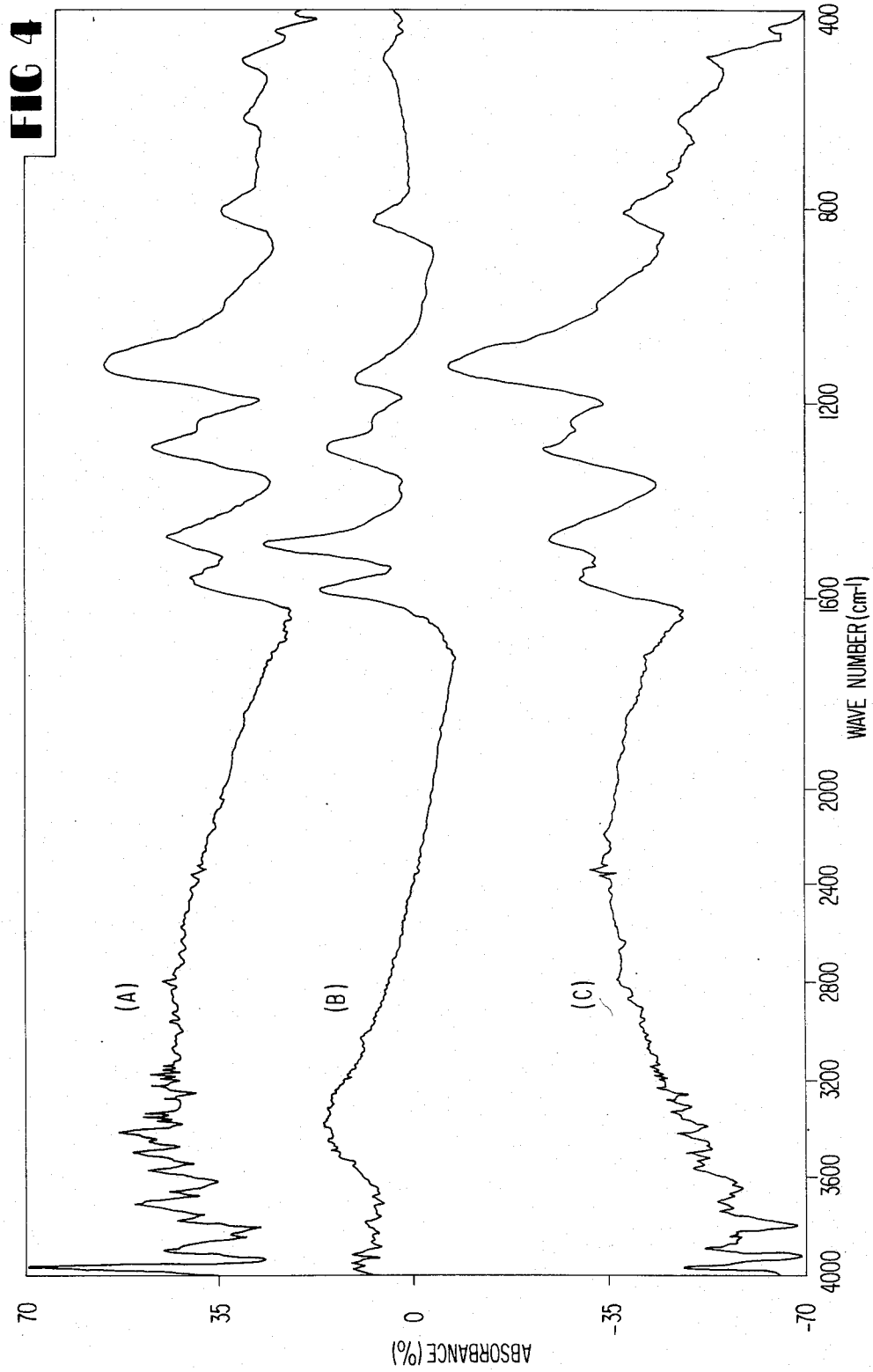
FIGS. 4(A), (B), and (C) are infrared absorption spectra respectively of a polymer produced by the present invention, a polymer obtained by compensating ammonia for the polymer of (A), and a polymer obtained by again doping the polymer of (B) with sulfuric acid.

When the polymer of this invention is chemically compensated with ammonia, it undergoes significant loss of electroconductivity and changes its appearance from a blackish green color to a purple color. If this polymer is then doped with an electron acceptor such as sulfuric acid, the original high electroconductivity is restored, as well as the original blackish green color. This change is reversible. If the chemical compensation and the doping are repeated, the same results can be obtained repeatedly. The changes in the polymer appearing in the infrared absorption spectrum as a consequence of the chemical compensation and doping are illustrated in FIG. 4. In FIG. 4, the curve A represents the spectrum of the polymer in the unaltered form, the curve B the spectrum of the polymer in the chemically compensated form, and the curve C the spectrum of the polymer in the doped form. Evidently, the spectrum of C agrees substantially completely with the spectrum of A. This fact indicates that the above chemical compensation and doping cause no change in the skeletal structure of the polymer, but induce transfer of electrons between the polymer and the chemical compensation reagent or the electron acceptor. It is, accordingly, understood that owing to the mechanism described above, the polymer of this invention is doped with the electron acceptor during the course of the oxidative polymerization, and as a result, the polymer contains a dopant.

Examples of the dopant which the electroconductive polymer of this invention can contain include halogens such as chlorine, bromine, and iodine, Lewis acids such as ferric chloride, tin tetrachloride, and copper dichloride, inorganic acids such as hydrogen chloride, hydrogen bromide, sulfuric acid, and nitric acid, and organic acids such as picric acid, and p-toluenesulfonic acid. Of course, the foregoing list of dopants is only exemplary, and dopants useful according to the present invention are not limited thereto.

The chemical structure of the electroconductive polymer according to the present invention is confirmed by the elementary analysis of the polymer itself and also by the elementary analysis of the polymer produced by chemically compensating the original polymer with ammonia (hereinafter referred to as "compensated polymer"). The polymer is a linear high molecular polymer substantially of the abovedescribed repeating unit. It is believed to acquire high electroconductivity because the $\pi$ electron conjugate system of the polymer contains the dopant.

Optionally, the electroconductive organic polymer of the present invention may contain, in conjunction with the above repeating unit of quinonediimine structure, a repeating unit represented by Formula (IV) which is a reduced structure of Formula (III)

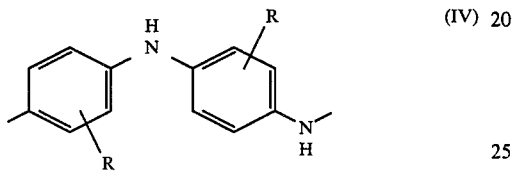

wherein R represents a hydrogen atom or an alkyl group. The polymer containing such a reduced structure can be easily produced by, for example, partially reducing the polymer of this invention. After the polymer comprising a repeating unit of Formula (IV) is produced by reduction, the electroconductive organic polymer of this invention can also be obtained by oxidizing and simultaneously doping the reduced polymer with an oxidizing agent which is effective as an electron acceptor.

As described above, the electroconductive organic polymer produced by the oxidative polymerization of an aniline compound preferably comprises substantially the above repeating unit (III). Since this polymer has already been doped with a protonic acid during the course of the oxidative polymerization, it possesses high electroconductivity without requiring an additional doping treatment, and the electroconductivity of the polymer is retained even when the polymer is left standing in the atmosphere for a long time. Compared with the doped electroconductive organic polymers heretofore known to the art, the polymer of the present invention specifically possesses high stability.

The high molecular weight electroconductive oxidation polymer of aniline compound described above can be produced by various methods, which can be roughly divided into two types. The first method comprises oxidatively polymerizing an aniline compound or a water-soluble salt thereof with a chemical oxidizing agent in the presence of a dopant, and the second method comprises electrolytically oxidizing an aniline compound or a water-soluble salt thereof in the presence of a supporting electrolyte and a dopant. As described previously, the reaction conditions in these methods must be properly selected to ensure the production of a highly electroconductive polymer.

The first method comprising the polymerization by chemical oxidation will be described hereinafter in detail.

The electroconductive organic polymer according to the present invention can be obtained by subjecting an aniline compound, or a water-soluble salt thereof to oxidative polymerization in a reaction medium containing a protonic acid and an oxidizing agent.

Preferred examples of the alkylaniline include o-methylaniline, m-methylaniline, o-ethylaniline, and m-ethylaniline. Of aniline and these alkylanilines, aniline is particularly preferred since it produces a polymer of high electroconductivity.

Of the water-soluble salts of aniline compounds, generally hydrochlorides, sulfates and other mineral acid salts are preferred, but the present invention is not limited to such salts. The oxidizing agent is not specifically limited, either. Preferred examples of the oxidizing agent are chromium oxide (IV) and dichromates such as potassium dichromate and sodium dichromate. Of these oxidizing agents, potassium dichromate is most preferred. If necessary, the oxidizing agent may be selected from among chromium type oxidizing agents such as chromic acid, chromates, and chromyl acetate and manganese type oxidizing agents such as potassium permanganate. Examples of the protonic acid which can be used include sulfuric acid, hydrochloric acid, hydrobromic acid, tetrafluoroboric acid ($HBF_4$), and hexafluorophosphoric acid ($HPF_6$), with sulfuric acid being most preferred. When a mineral acid is used for the formation of the water-soluble salt of aniline compound, this mineral acid may be the same as or different from the above-described protonic acid.

Examples of reaction medium include water, organic solvents miscible with water, and organic solvents not miscible with water, and mixtures thereof. When a water-soluble salt of aniline compound is used, the reaction medium to be used is generally water, an organic solvent miscible with water, or a mixture thereof which is capable of dissolving the water-soluble salt. When an aniline compound itself is used, the reaction medium can be either an organic solvent miscible with water or an organic solvent not miscible with water which is capable of dissolving the aniline compound. It is important that the organic solvent to be used as the reaction medium should not be oxidized by the oxidizing agent used in the reaction. Examples of organic solvents miscible with water include ketones, ethers, and organic acids such as acetone, tetrahydrofuran, and acetic acid, and examples of organic solvents not miscible with water include carbon tetrachloride and hydrocarbons.

In a particularly desirable procedure for the production of the electroconductive organic polymer by the method of this invention, the protonic acid-containing reaction medium in which an aniline compound or a water-soluble salt thereof is subjected to oxidative polymerization with an oxidizing agent to produce an electroconductive polymer is used in such a manner that the molar ratio of protonic acid/potassium dichromate in the reaction medium is adjusted at least 1.2/1. Although there is no definite upper limit for this molar ratio, it is generally about 50/1.

The reaction temperature is not particularly limited as long as it does not exceed the boiling point of the solvent to be used. The electroconductivity of the oxidation polymer obtained tends to decrease with the increasing reaction temperature. From the standpoint to produce a polymer having a high electroconductivity, the reaction temperature is desirably below room temperature.

A particularly preferred method comprises adding dropwise an aqueous protonic acid solution of the oxidizing agent under stirring into an organic solution of an aniline compound or an aqueous solution of the water-soluble salt of an aniline compound or adding the above-described aqueous protonic acid solution all at once to the above aniline compound solution thereby effecting the oxidative polymerization reaction. Generally, the polymer is precipitated after an induction period of about 0.5 to about 5 minutes. Thus, the reaction is quickly completed, but generally, the reaction mixture is further stirred for aging for a period of about 10 minutes to about 5 hours after completion of the reaction. Then, the reaction mixture is poured into a large volume of water or an organic solvent, for example, acetone or methanol, and filtered to separate the formed polymer. The polymer is washed with water until the filtrate becomes neutral, washed with an organic solvent such as acetone until the solvent is not colored, and vacuum dried to obtain an electroconductive organic polymer of this invention.

In the method described above, the electroconductivity of the electroconductive organic polymer obtained thereby has a close correlation with the composition of the reaction medium containing the protonic acid and the oxidizing agent wherein the oxidative polymerization of an aniline compound is conducted. In order to obtain a polymer having a high electroconductivity, selection of the composition of the above-described reaction medium is very important. In order to obtain the polymer having an electroconductivity exceeding $10^{-6}$ S/cm, it is necessary that the molar ratio of protonic acid/potassium dichromate in the reaction medium in which the reaction proceeds should exceed 1.2/1, preferably in the range of 2/1 to 50/1. Generally, under this oxidative polymerization condition, a polymer having a high electroconductivity on the order of $10^{-3}$ to $10^1$ S/cm can be obtained. When the reaction is carried out by adding an aqueous protonic acid solution of the oxidizing agent to an organic solution of aniline compound or the aqueous solution of a water-soluble salt thereof, the concentration of the protonic acid in the aqueous solution of oxidizing agent is not particularly limited. Generally, however, this concentration is in the range of from 1 to 10N.

In the method described above, the electroconductivity of the polymer produced is substantially constant when the molar ratio of protonic acid/potassium dichromate in the reaction medium in which the oxidative polymerization of an aniline compound is carried out is fixed. Thus, by this method, the polymer having a predetermined degree of electroconductivity can be obtained with high reproducibility. The amount of potassium dichromate relative to the aniline compound determines the yield of the polymer produced. The electroconductivity of the produced polymer, however, is not substantially affected by the amount of potassium dichromate used in the reaction. The organic polymer having a predetermined degree of electroconductivity, therefore, can be practically obtained in a quantitative yield when the aqueous solution of the oxidizing agent has a prescribed molar ratio of protonic acid/potassium dichromate and the potassium dichromate is used in at least an equivalent weight relative to the aniline compound.

The second method comprising the polymerization by electro-oxidation is hereinafter described in detail.

The electroconductive organic polymer of this invention can also be produced by subjecting an aniline compound solution containing an aniline compound or a water-soluble salt thereof and a protonic acid in at least an equimolar amount relative to the aniline compound to electro-oxidative polymerization in a solvent at an electrode potential of at least +1 V relative to the standard calomel electrode at a current density of 0.01 mA/cm² to 1 A/cm².

The protonic acid used in the present invention is preferably that having an oxidative potential higher than the oxidative potential used in this method. Preferred examples of protonic acids which meet this requirement include hydrochloric acid, hydrobromic acid, sulfuric acid, nitric acid, perchloric acid, tetrafluoroboric acid ($HBF_4$), hexafluorophosphoric acid ($HPF_6$). In order to produce an electroconductive organic polymer having a high electroconductivity exceeding $10^{-6}$ S/cm according to the present invention, it is necessary that the protonic acid should be used in at least an equimolar amount, generally 1 to 5 molar equivalents, relative to the aniline compound and, at the same time, the aniline compound solution should be subjected to the electro-oxidative polymerization at an electrode potential of at least +1 V relative to the standard calomel electrode. When the electro-oxidation potential is lower than +1 V or the current density is outside the above range, the resulting polymer has a low molecular weight and a low electroconductivity.

It is preferred that the concentration of the aniline compound in the aniline compound solution is 1% by weight or more. When the concentration is lower than 1% by weight, the resulting polymer tends to have lower molecular weight and lower electroconductivity. Although there is no upper limit in the concentration of the aniline compound in the aniline compound solution, the concentration up to about 50% by weight is generally preferred.

The solvent used in this method is preferably such that it dissolves both the protonic acid and the aniline compound and has stable decomposition potential at the oxidation potential used during the electro-oxidative polymerization. Preferred examples of the solvent include aliphatic lower alcohols such as methanol and ethanol, nitriles such as acetonitrile and benzonitrile, ketones such as methyl ethyl ketone, and amides such as N,N-dimethylformamide. Water has a decomposition potential of 1.23 V and, therefore, in some instance, it has a decomposition potential higher than the electro-oxidation potential used in the present invention. Thus, in the present invention, even when water is used as a solvent, the oxidation polymer of aniline compound having a high molecular weight and high electroconductivity can be produced by adjusting the electro-oxidation potential to +1 V or more.

The oxidation potential of aniline compound can be determined through the so-called cyclic voltamogram by scanning the potential at a fixed rate and plotting the current value at various potentials. As is noted from FIG. 15, the oxidation potential relative to SCE appears near about 1 V, about 2 V and about 3 V. These oxidation potentials correspond to oxidizing force of the chemical oxidizing agent. At each of the oxidation potentials, a polymer at this particular oxidation potential is formed predominantly, and at an intermediate between two adjacent oxidation potentials, polymers at lower oxidation potentials are formed competitively.

As described previously, Mohilner et al. conducted the electro-oxidation of aniline at an oxidation potential of +0.8 V relative to SCE so as to avoid electrolytic decomposition of water. In accordance with the present invention, an aniline polymer having a far higher molecular weight and a higher electroconductivity than those of emeraldine can be produced by carrying out the electro-oxidation at an electrode potential of +1 V or higher, preferably at an electrode potential in the range of 2 to 10 V.

In the present invention, the current density used in the electro-oxidation is also an important factor. If the current density is less than 0.01 mA/cm$^2$, the polymer produced possesses a low molecular weight probably in view of the fact that the polymer is soluble in dimethylformamide, and the resulting polymer has a lower electroconductivity.

In the present invention, the aniline compound solution may additionally contains a supporting electrolyte other than the above-described protonic acid. Examples of the supporting electrolyte are metal salts of perchloric acid such as lithium perchlorate and sodium perchlorate and organic salts such as tetrabutyl ammonium perchlorate. Further, such salts as nitrates, sulfates, hydrochlorides, tetrafluoroborates, and hexafluorophosphates can be used as supporting electrolytes.

As described previously, the electroconductive organic polymer of this invention can also be produced by first reducing the electroconductive organic polymer with a reducing agent and then oxidizing and simultaneously doping the reduced polymer with an oxidizing agent which is effective as an electron acceptor. The electroconductive organic polymer thus obtained also has the same polymer structure as that of the polymer prior to the reduction, except that the dopant is replaced by a different dopant, and such polymers are also within the scope of this invention. The dopant which can be used in the above described reduction and reoxidation process includes, among those previously described, a halogen such as chlorine, bromine, and iodine, and a Lewis acid such as ferric chloride, stannic chloride, and cupric chloride.

The electroconductive organic polymer obtained by the oxidative polymerization of an aniline compound according to the present invention has already been doped with the protonic acid during the polymerization and, therefore, it possesses a high electroconductivity without requiring an additional doping treatment. Furthermore, this electroconductivity is not altered even after the polymer has been allowed to stand in air for a long time. As compared with conventionally known doped electroconductive organic polymers, the polymer of this invention has specifically high stability.

The present invention is described more specifically with reference to Examples. However, it should be noted that the present invention is not limited thereto.

EXAMPLE 1

(1) Production of polymer 45 g of water and 4 ml of concentrated hydrochloric acid were charged into a flask having a capacity of 300 ml, and 5 g (0.0537 mol) of aniline was dissolved therein to prepare an aqueous solution of aniline hydrochloride. The flask was then cooled with ice water.

Separately, an aqueous solution of oxidizing agent (molar ratio of protonic acid/potassium dichromate, 7.5/1) was prepared by adding 4.61 g (0.047 mol) of concentrated sulfuric acid in 28.8 g of water and dissolving 1.84 g (0.00625 mol) of potassium dichromate therein. This solution was then added dropwise through a dropping funnel over a period of 30 minutes under stirring to the above aqueous solution of aniline hydrochloride cooled with ice water. During the first 2 to 3 minutes of the dropwise addition, the solution in the flask only colored a yellow color. Thereafter, a green solid was precipitated quickly whereby the reaction solution turned into a blackish green color.

After completion of the dropwise addition, the reaction solution was stirred for additional 30 minutes. Then, the reaction mixture was poured into 400 ml of acetone, and the stirring was further continued for 2 hours. Then, the polymer formed in the reaction mixture was separated by filtration, washed by agitation in distilled water and separated by filtration. This washing procedure was repeated until the filtrate became neutral. Finally, the polymer separated by filtration was washed repeatedly with acetone until the filtrate was not colored. The polymer separated by filtration was vacuum dried over phosphorus pentoxide at room temperature for 10 hours to produce an electroconductive organic polymer as a green powder.

(2) Properties of polymer

The polymer obtained above was added to concentrated sulfuric having a 97% concentration at room temperature and stirred to determine the solubility. The amount of polymer dissolved therein was 1.2% by weight. A polymer solution in 97% concentrated sulfuric acid in a concentration of 5 g/dl was found to have a logarithmic viscosity number of 0.46 at 30° C. For comparison, viscosity of emeraldine and Diamond black were tested under the same conditions and found to have a logarithmic viscosity numbers of 0.02 and 0.005, respectively.

Figure 5:
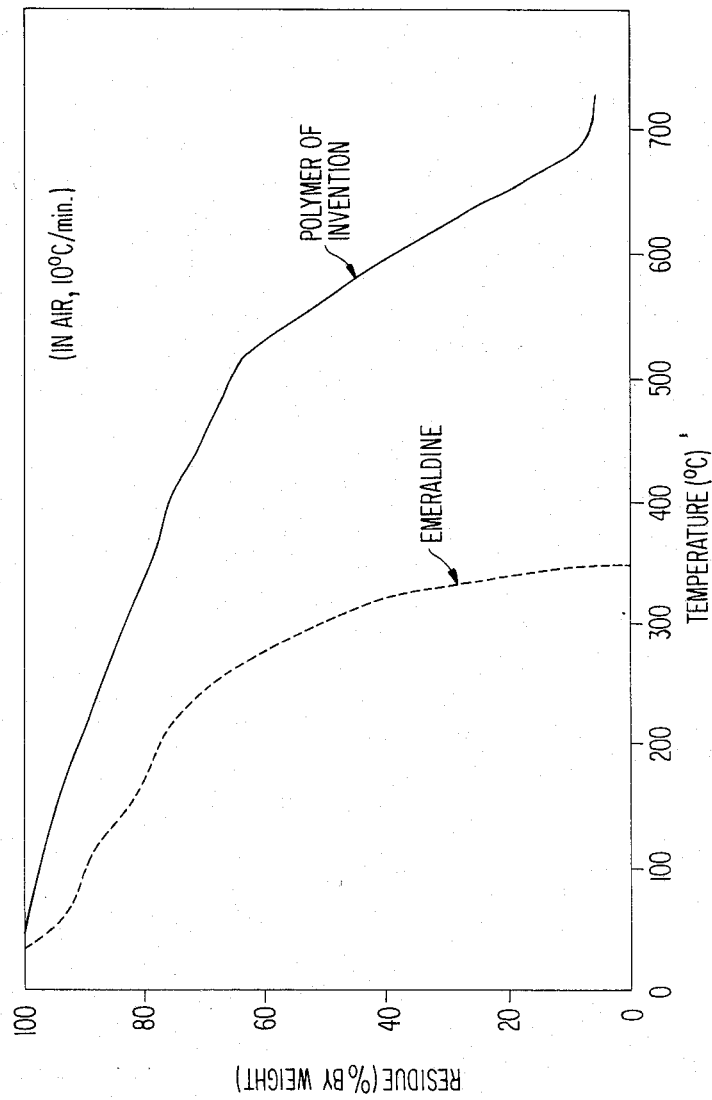
FIG. 5 is a graph showing ratios of weight residue of the polymer of this invention and emeraldine after heating.

The above polymer of this invention and emeraldine were subjected to thermogravimetric analysis in air. The results are shown in FIG. 5. The temperature increasing rate in the test was 10° C./minute.

Then, an about 120 mg portion of the polymer powder obtained above was pulverized in an agate mortar. The polymer powder was compression molded under pressure of 6000 kg/cm$^2$ using a compression molder designed for the preparation of a tablet for the measurement by an infrared spectrophotometer to produce a disk 13 mm in diameter. With four copper foils about 1 mm in width applied fast on the four corners of the disk with silver paste or graphite paste, the disk was tested in the air for electroconductivity by the van der Pauw method (L. J. van der Pauw, Philips Research Reports, Vol. 13, No. 1, R334, February 1958). Thus, the electroconductivity was found to be 2.0 S/cm. This molded polymer showed substantially the same level of electroconductivity when measured under a vacuum of $10^{-2}$ Torr. When this disk was allowed to stand in the air for four months, the electroconductivity was not substantially altered.

(3) Infrared absorption spectrum of polymer

The infrared absorption spectrum of the polymer produced above is shown in FIG. 1. For comparison, the infrared absorption spectra of emeraldine and Diamond black are shown respectively in FIG. 2 and FIG. 3. The emeraldine was prepared by the method described by A. G. Green et al. (A. G. Green et al., J. Chem. Soc., Vol. 97, p. 2388 (1910)).

The infrared absorption spectrum of the polymer of this invention is similar to that of emeraldine and, at the same time, differs widely in some respects. For example, in the absorption spectrum of emeraldine, clear absorption by the deformation vibration outside the C-H plane due to the mono-substituted benzene is observed at 690 cm$^{-1}$ and 740 cm$^{-1}$. In the absorption spectrum of the polymer of this invention, however, this absorption is not substantially observed and, instead, strong absorption at 800 cm$^{-1}$, indicating the presence of para-substituted benzene is observed. This is because the absorption due to the mono-substituted benzene at the terminal of molecule appears relatively stongly in the emeraldine which is a low molecular weight compound, whereas the absorption due to the para-substituted benzene forming a high molecular chain appears relatively strongly in the polymer of this invention which is a high molecular weight compound. In contrast, the infrared absorption spectrum of aniline black is markedly different from both the infrared absorption spectra of the polymer of this invention and the emeraldine. The difference is particularly apparent in the absorption of large width in the neighborhood of 3200 to 3400 cm$^{-1}$, the absorption apparently due to a quinolic carbonyl group at 1680 cm$^{-1}$, the region of C—N stretching vibration at 1200 to 1300 cm$^{-1}$, and the region below 600 cm$^{-1}$.

The assignment of the infrared absorption spectrum of the polymer of the present invention is as shown below: 1610 cm$^{-1}$ (C=N stretching vibration at shoulder), 1570 and 1480 cm$^{-1}$ (C-C stretching vibration in benzene ring), 1300 and 1240 cm$^{-1}$ (C—N stretching vibration), 1120 cm$^{-1}$ (absorption ascribable to dopant; absorption generated at substantially the same position without reference to the kind of dopant), 800 cm$^{-1}$ (deformation vibration outside C—H plane of para-substituted benzene), and 740 and 690 cm$^{-1}$ (deformation vibration outside C—H plane of monosubstituted benzene).

The infrared absorption spectrum of the polymer obtained by compensating the above-described polymer with ammonia is shown iN FIG. 4(B) and that of the polymer obtained by again doping the polymer of FIG. 4(B) with 5N sulfuric acid is shown in FIG. 4(C). The spectrum of the polymer obtained by repeated doping is virtually identical with the spectrum of the initial polymer shown in FIG. 4(A). The electroconductivity of the polymer obtained by repeated doping is the same as the initial polymer. The variation of the electroconductivity was 0.45 S/cm before the compensation (A), 1.6×10$^{-8}$ S/cm after the compensation (B), and 0.31 S/cm after the repeated doping (C). The data clearly indicate that the polymer of the present invention is doped with the protonic acid used during the course of the oxidative polymerization.

(4) Chemical structure of polymer

The electroconductive polymer produced as described above in accordance with this invention was subjected to elementary analysis. Even after this polymer was refined by washing with water and washing with acetone, green powder of anhydrous chromium oxide (Cr$_2$O$_3$) was recognized to remain as a residue after the elementary analysis. Thus, the measured values of elementary analysis are shown herein in conjunction with the values determined by calculation based on the total taken as 100. It is noted that the calculated values well consistent with the theoretical values. The results obtained similarly with respect to the polymer chemically compensated with ammonia are also shown.

| (a) Polymer containing sulfuric acid as dopant C$_{12}$H$_8$N$_2$(H$_2$SO$_4$)$_{0.58}$ (repeating unit) | | | |
|---|---|---|---|
| | Theoretical values | Measured values | Calculated values |
| C | 60.79 | 58.11 | 60.99 |
| H | 3.89 | 4.05 | 4.25 |
| N | 11.81 | 10.80 | 11.34 |
| S | 7.84 | 7.45 | 7.82 |
| O | 15.66 | (14.87) | (15.61) |

The amount of sulfuric acid indicated in the theoretical formula was calculated based on the amount actually measured of sulfur in the polymer and the amount of oxygen was stoichiometrically calculated on the basis of the amount of sulfuric acid so determined. In the measured values, the amount of oxygen was calculated on the basis of the amount of sulfuric acid which was calculated from the measured value of sulfur content.

| (b) Compensated polymer C$_{12}$H$_8$N$_2$ (repeating unit) | | | |
|---|---|---|---|
| | Theoretical values | Measured values | Calculated values |
| C | 79.98 | 73.24 | 79.77 |
| H | 4.48 | 4.34 | 4.73 |
| N | 15.54 | 14.23 | 15.50 |

EXAMPLE 2

(1) Effect on electroconductivity of produced polymer by molar ratio of sulfuric acid/potassium dichromate in aqueous sulfuric acid solution of oxidizing agent having a constant sulfuric acid concentration 45 g of water and 4 ml of concentrated hydrochloric acid were charged into a flask having a capacity of 300 mm and 5 g (0.0537 mol) of aniline was dissolved therein to prepare an aqueous solution of aniline hydrochloride.

Separately, an aqueous solution of oxidizing agent having a varying molar ratio of sulfuric acid/potassium dichromate was prepared by dissolving 1.84 g (0.00625 mol) of potassium dichromate in a varying amount of 3N sulfuric acid. This aqueous solution of oxidizing agent was added dropwise through a dropping funnel under agitation to the above aqueous solution of aniline hydrochloride at room temperature. After completion of the dropwise addition, the reaction mixture was further stirred for 30 minutes. It was then poured into 400 ml of acetone and stirred for 2 hours. The polymer formed was separated by filtration and dried.

The unrefined electroconductive polymer thus produced was tested for electroconductivity (δ). The results are shown with blank circles ◯ in FIG. 6. The polymer was washed with distilled water and acetone, and separated by filtration. This washing procedure was repeated until the filtrate became neutral and colorless. The refined polymer obtained was tested for electroconductivity. The results are shown with black circles ● in FIG. 6. Similarly, in all the subsequent Figures, the data obtained of unrefined polymers are shown with blank circles ◯ and those of refined polymers with black circles ●.

Figure 6:
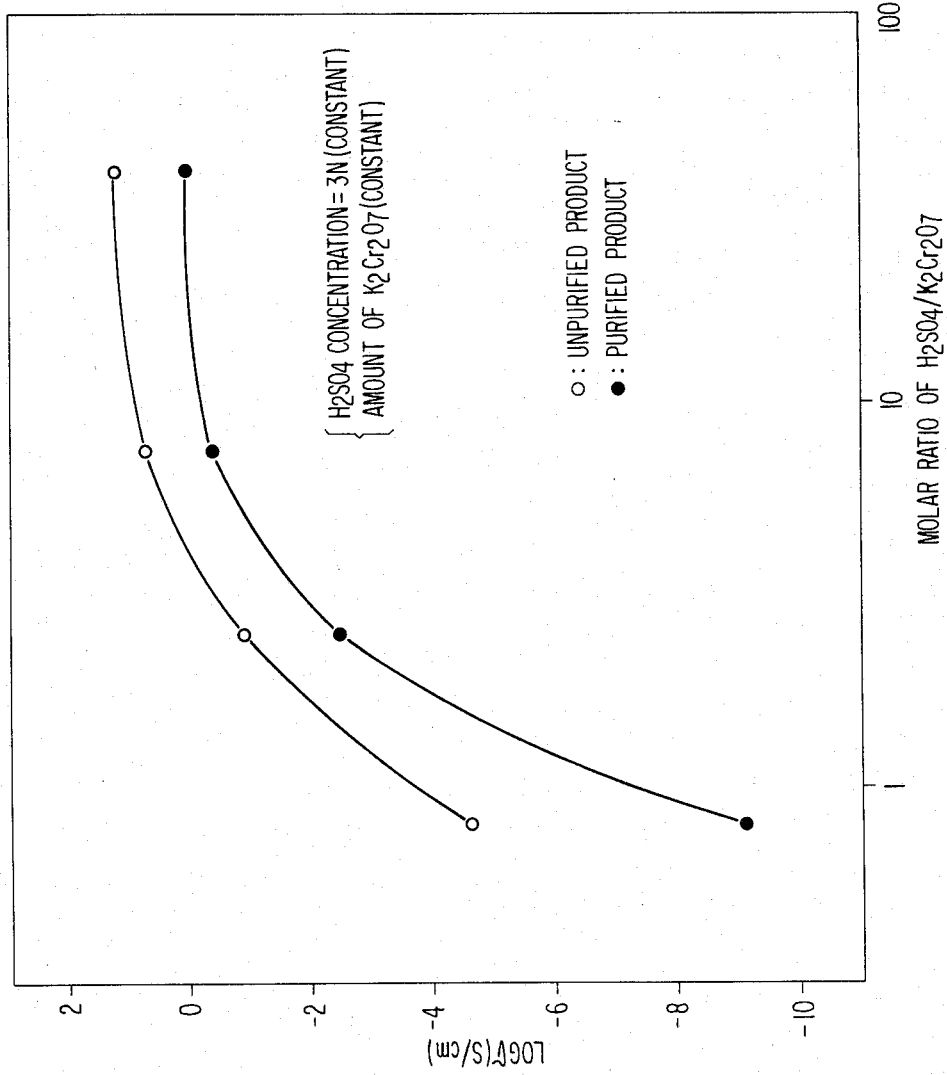
FIG. 6 is a graph showing the relation between the molar ratio of sulfuric acid/potassium dichromate in the aqueous solution of an oxidizing agent having a fixed sulfuric acid concentration and the electroconductivity of the produced polymer as determined in the method of this invention.

It is noted from the results of FIG. 6 that the electroconductive polymer having a electroconductivity exceeding 10$^{-6}$ S/cm can be obtained when the molar ratio of protonic acid/potassium dichromate in the aqueous solution of oxidizing agent is adjusted to 1.2/1 or more.

(2) Effect on electroconductivity and yield of polymer by molar ratio of sulfuric acid/potassium dichromate in aqueous sulfuric acid solution having a constant potassium dichromate concentration An aqueous solution containing 5.2% by weight of potassium dichromate was prepared by dissolving 1.84 g (0.00625 mol) of potassium dichromate in a fixed weight of sulfuric acid of varying concentration. This aqueous solution of oxidizing agent was added dropwise at room temperature with stirring into an aqueous solution containing 0.0537 mol of aqueous solution of aniline hydrochloride similarly to Example 1, to produce a polymer of the present invention.

Figure 7:
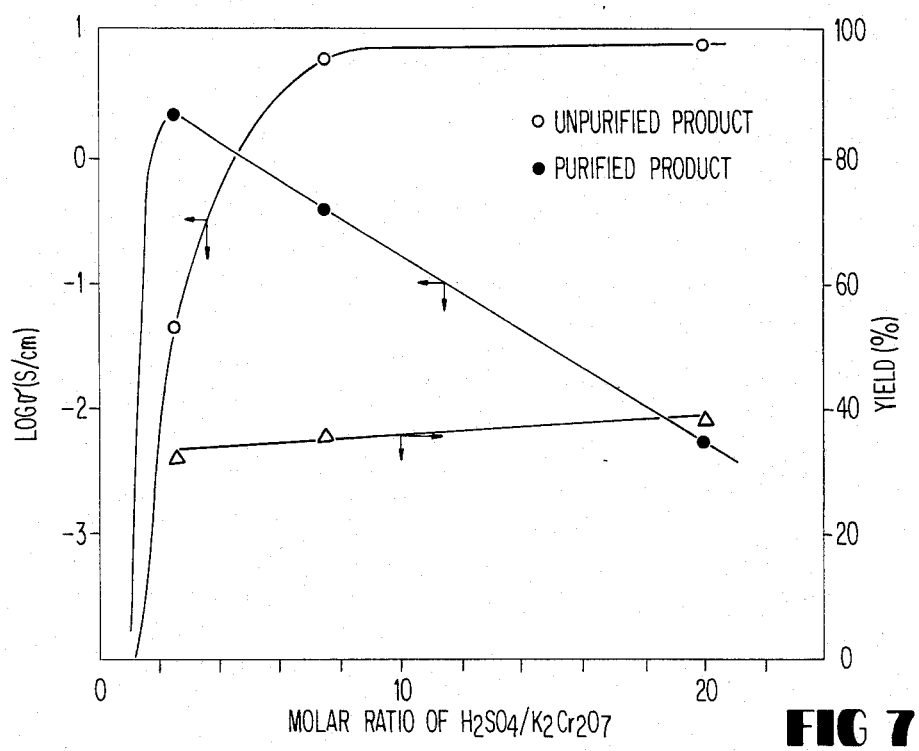
FIG. 7 is a graph showing the relation between the molar ratio of sulfuric acid/potassium dichromate in an aqueous sulfuric acid solution containing potassium dichromate at a fixed concentration and the yield and the electroconductivity of the produced polymer.

The relation between the molar ratio of sulfuric acid/potassium dichromate in the aqueous solution of oxidizing agent and the yield and electroconductivity of the polymer is shown in FIG. 7. It is noted from the data that the polymer having a electroconductivity exceeding $10^{-6}$ S/cm can be obtained when the above molar ratio is at least 1.2/1 and that the yield of the polymer is practically constant when the amount of potassium dichromate to aniline is fixed.

(3) Effect by potassium dichromate concentration on electroconductivity

Aqueous potassium dichromate solutions having various concentrations were prepared by dissolving potassium dichromate in aqueous sulfuric acid solution having various concentrations in an amount sufficient to give solutions having a sulfuric acid/potassium dichromate molar ratio of 7.5/1. Each of the aqueous solutions was added dropwise at room temperature to an aqueous solution containing aniline hydrochloride in an amount of about 9 molar times, the amount of potassium dichromate present to produce a polymer of this invention.

Figure 8:
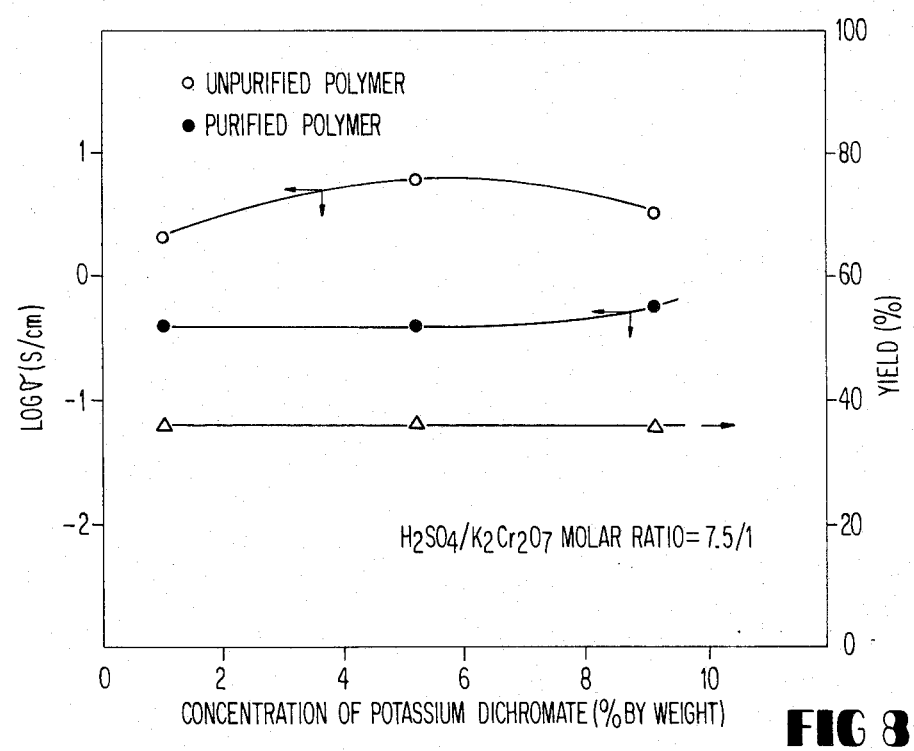
FIG. 8 is a graph showing the effects upon the yield and electroconductivity of the polymer produced that are exerted by the potassium dichromate concentration of an aqueous sulfuric acid solution of the oxidizing agent having a fixed molar ratio of sulfuric acid/potassium dichromate.

The results are shown in FIG. 8. It is noted from FIG. 8 that even when the potassium dichromate concentration in the aqueous solution of oxidizing agent is varied, the yield of the polymer is practically constant and the electroconductivity of the polymer is similarly constant so long as the molar ratio of sulfuric acid/potassium dichromate is fixed and the amount of potassium dichromate relative to aniline is fixed.

(4) Effect on electroconductivity and yield of polymer by amount of potassium dichromate relative to aniline An aqueous solution of oxidizing agent having a sulfuric acid/potassium dichromate molar ratio of 7.5/1 was prepared by dissolving potassium dichromate in 3N sulfuric acid.

This aqueous solution of oxidizing agent was added in a varying amount to the same aqueous aniline hydrochloride solution as prepared in Example 1 to produce a polymer of this invention.

Figure 9:
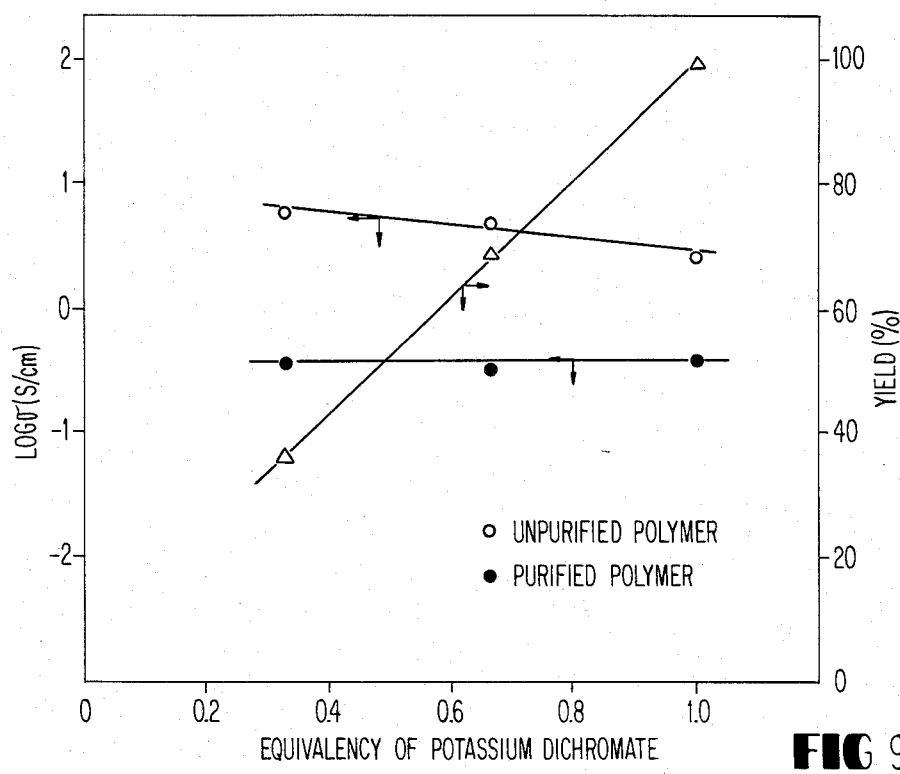
FIG. 9 is a graph showing the relation between the equivalency to aniline of an aqueous sulfuric acid solution of the oxidizing agent having a fixed molar ratio of sulfuric acid/potassium dichromate and the yield and the electroconductivity of the polymer produced.

The polymer was tested for effect of the amount of potassium dichromate relative to aniline on the electroconductivity and yield of the produced polymer. The results are shown in FIG. 9. In this case, 1 mol of potassium dichromate in the sulfuric acid solution corresponded to 3 equimolar amount relative to aniline. In FIG. 9, the expression "equivalency of potassium dichromate" means the equivalency of potassium dichromate as the oxidizing agent relative to aniline. It is noted from FIG. 9 that the electroconductivity of the polymer produced is practically constant because the sulfuric acid/potassium dichromate molar ratio is fixed and that the yield of the produced polymer is practically proportional to the amount of potassium dichromate in the aqueous solution of oxidizing agent relative to aniline.

(5) Effect of aniline concentration on electroconductivity and yield of polymer

An aqueous solution of oxidizing agent having a sulfuric acid/potassium dichromate molar ratio of 7.5/1 and a potassium dichromate concentration of 5.2% by weight was prepared by dissolving potassium dichromate in 3N sulfuric acid. This aqueous solution of oxidizing agent was added to aniline in a proportion such that the equivalent number of potassium dichromate to aniline reached $\frac{1}{8}$ to produce a polymer of this invention. The results are shown in FIG. 10.

Figure 10:
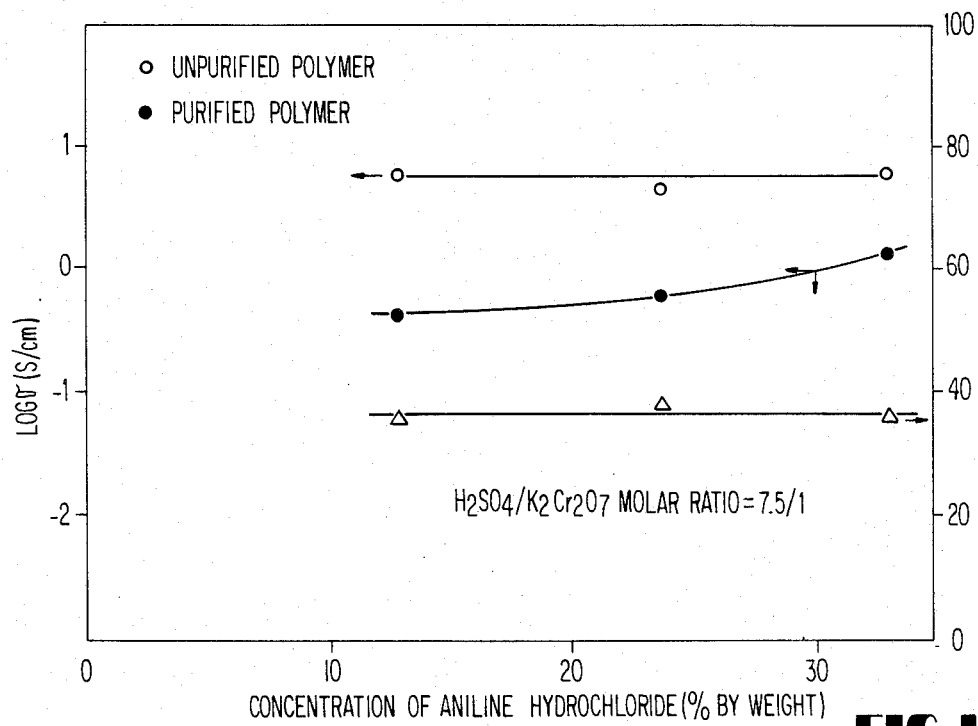
FIG. 10 is a graph showing the relation between the aniline hydrochloride concentration and the yield and the electroconductivity of the polymer produced as determined when an aqueous solution of the oxidizing agent having a fixed molar ratio of sulfuric acid/potassium dichromate was used in a fixed amount.

It is noted from FIG. 10 that the polymer produced of practically constant electroconductivity is obtained in a practically constant yield when the sulfuric acid/potassium dichromate molar ratio is in the aqueous solution of oxidizing agent is fixed and the amount of potassium dichromate relative to aniline is fixed.

EXAMPLE 3

An aqueous aniline solution was prepared by dissolving 6.48 g (0.050 mol) of aniline hydrochloride in 84 ml (0.126 mol) of 3N sulfuric acid. This aqueous aniline solution was added dropwise at room temperature to an aqueous solution having 4.90 g (0.0167 mol) of potassium dichromate dissolved therein. After completion of the dropwise addition, the reaction mixture was aged for 30 minutes. In the reaction above, the protonic acid/potassium dichromate molar ratio was 7.5/1.

The polymer precipitated in the reaction mixture was separated by filtration, washed with water similarly to the procedure of Example 1, washed with acetone, and then vacuum dried to produce a polymer of this invention. By the same test as conducted in Example 1, the electroconductivity of this polymer was found to be $2.8 \times 10^{-2}$ S/cm.

EXAMPLE 4

5 g (0.0537 mol) of aniline was dissolved in 45 g of tetrahydrofuran in a flask having a capacity of 300 ml.

Separately, 13.17 g (0.134 mol) of concentrated sulfuric acid was added to 82.2 g of water and 5.27 g (0.0179 mol) of potassium dichromate was dissolved therein to prepare an aqueous solution of oxidizing agent (protonic acid/potassium dichromate molar ratio, 7.5/1). This aqueous solution was added dropwise through a dropping funnel at room temperature while stirring agitation to the above tetrahydrofuran solution of aniline over a period of 30 minutes. Immediately after the start of this dropwise addition, the solution turned into a yellow color. Subsequently, the solution precipitated a yellowish green brown powder. Shortly thereafter, this powder changed to a green color.

After completion of the dropwise addition, the reaction mixture was further stirred for 30 minutes. Then, the reaction mixture was poured into 600 ml of acetone and stirred for 2 hours. The polymer consequently formed was separated by filtration, and washed and dried according to the same procedure as in Example 1. The resulting polymer was found to have an electroconductivity of 0.25 S/cm. The solution of the polymer in 97% sulfuric acid was found to have a logarithmic viscosity number of 0.38.

EXAMPLE 5

The procedure of Example 4 was repeated, except that 45 g of carbon tetrachloride was used in the place of 45 g of tetrahydrofuran, to produce an blackish green polymer powder. This polymer was found to have an electroconductivity of 0.21 S/cm. A solution of this polymer in 97% sulfuric acid had a logarithmic viscosity number of 0.41.

EXAMPLE 6

Figure 11:
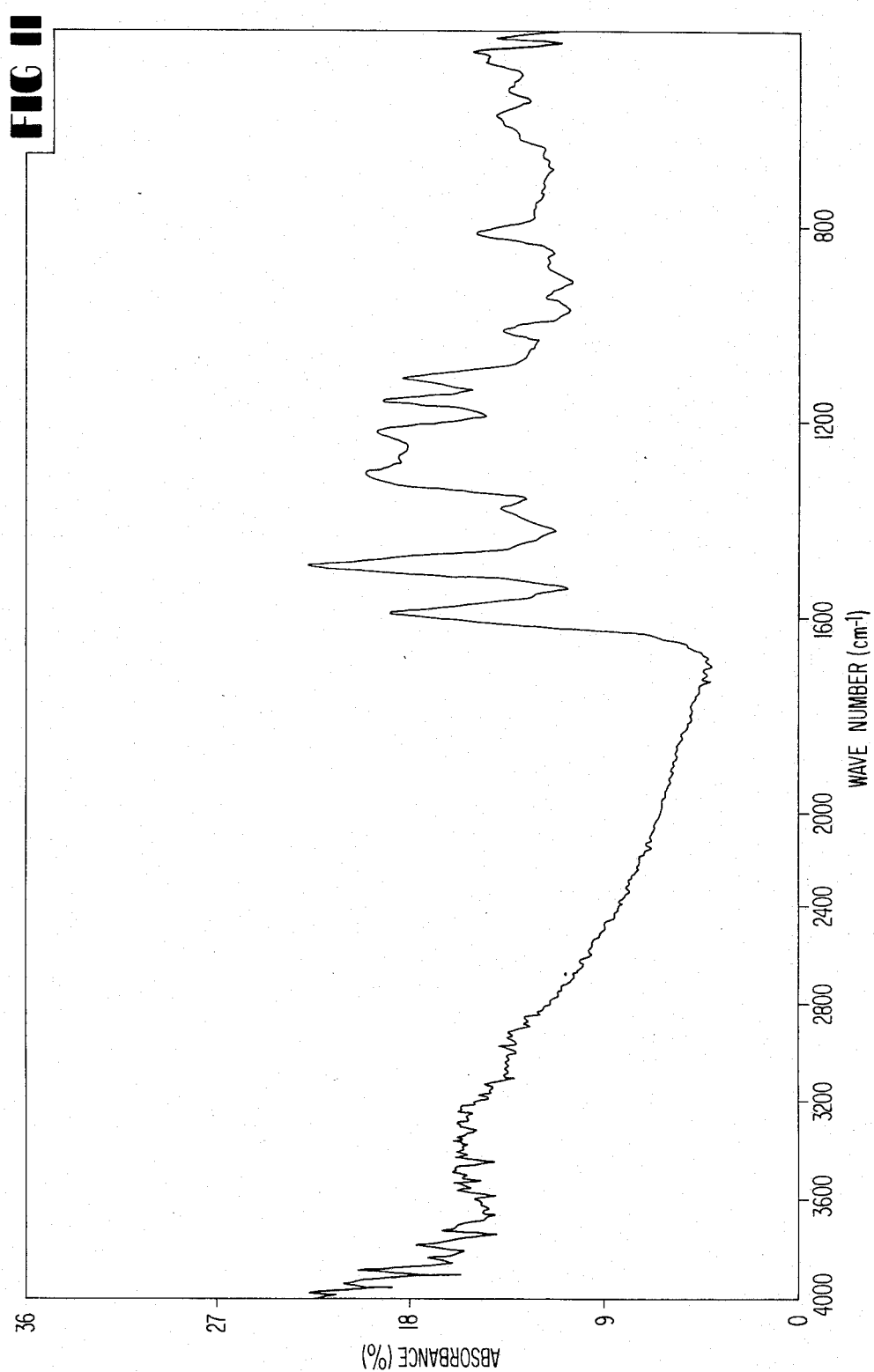
FIG. 11 is an infrared absorption spectrum of an electroconductive polymer of this invention obtained by the oxidative polymerization of o-toluidine.

The procedure of Example 1 was repeated, except that 5.75 g (0.0537 mol) of o-toluidine was used in the place of aniline, to produce a blackish blue green polymer powder. The infrared absorption spectrum of this polymer is shown in FIG. 11. The polymer was found to have an electroconductivity of $2.1 \times 10^{-1}$ S/cm. The solution of this polymer in 97% concentrated sulfuric acid had a logarithmic viscosity number of 0.25.

EXAMPLE 7 (RUN NO. 1)

(1) Production of polymer

In an aqueous solution containing 10% by weight of aniline and hydrochloric acid in an equimolar amount relative to aniline, a platinum anode and a platinum cathode were inserted and electric current was passed between the electrodes for 8 hours at an initial electrode potential of +1.8 V relative to SCE and a fixed current density of 5 mA/cm$^2$ to effect electro-oxidative polymerization. (As is well known, the electrode potential increases gradually when the electrolytic polymerization is carried out at a fixed current density, and, therefore, the electrode potential is usually indicated by the initial potential as described above.)

The aniline polymer formed on the anode in the above reaction was separated, pulverized, washed by stirring in distilled water, and separated by filtration. The separated polymer was then washed with acetone. The polymer was vacuum dried over phosphorus pentoxide at room temperature for 10 hours to obtain an electroconductive organic polymer of this invention as a green powder.

(2) Properties of polymer

The solubility of the polymer obtained above in sulfuric acid having 97% concentration at room temperature was determined and was found to be slightly low as compared with that of the polymer obtained by polymerization using chemical oxidation. However, the solubility was increased by ultrasonic treatment to a degree of 1% by weight. Since some insoluble solid material remained in the polymer solution, the solution was filtered through a glass filter to remove the insoluble material, and the filtrate was poured into a large volume of acetone to re-precipitate the polymer which was then separated by filtration, washed with water and dried to obtain a soluble portion of the polymer. The resulting polymer was again dissolved in 97% sulfuric acid at a concentration of 0.5 g/dl and a logarithmic viscosity number of the solution was determined at 30° C. which was found to be 0.40. For comparison, the logarithmic viscosity number of emeraldine and Diamond black was determined under the same conditions as described above and found to be 0.02 and 0.005, respectively.

Upon weighing the insoluble portion of the polymer remaining on the glass filter in the above-described procedure, it was found that the amount of this insoluble polymer is very small relative to the soluble portion of the polymer and does not substantially affect the polymer concentration value in the solution. Therefore, in subsequent Examples, the logarithmic viscosity was determined by a simplified method, i.e., with respect to a polymer solution obtained by dissolving the polymer in concentrated sulfuric acid at a concentration of 0.5 g/dl and removing a very small amount of insoluble material from the solution of filtration. Strictly speaking, the logarithmic viscosity number in subsequent Examples was determined with respect to a polymer solution having a polymer concentration slightly lower than 0.5 g/dl since a small amount of insoluble polymer had been removed from the polymer solution, but the difference in the determined viscosity values is substantially on a negligible order. Further, the viscosity determined by this simplified method ensures the minimum viscosity value because this viscosity value is always lower than that determined with respect to a polymer solution having a concentration of exactly 0.5 g/dl of the re-precipitated soluble polymer. Thus, when the logarithmic viscosity of the polymer determined by this simplified method is 0.1 or more at a concentration of 0.5 g/dl at 30° C., the solution of the re-precipitated polymer must also have a logarithmic viscosity number of 0.1 or more when determined under the same concentration and temperature and thus satisfies the requirement of the present invention.

Figure 15:
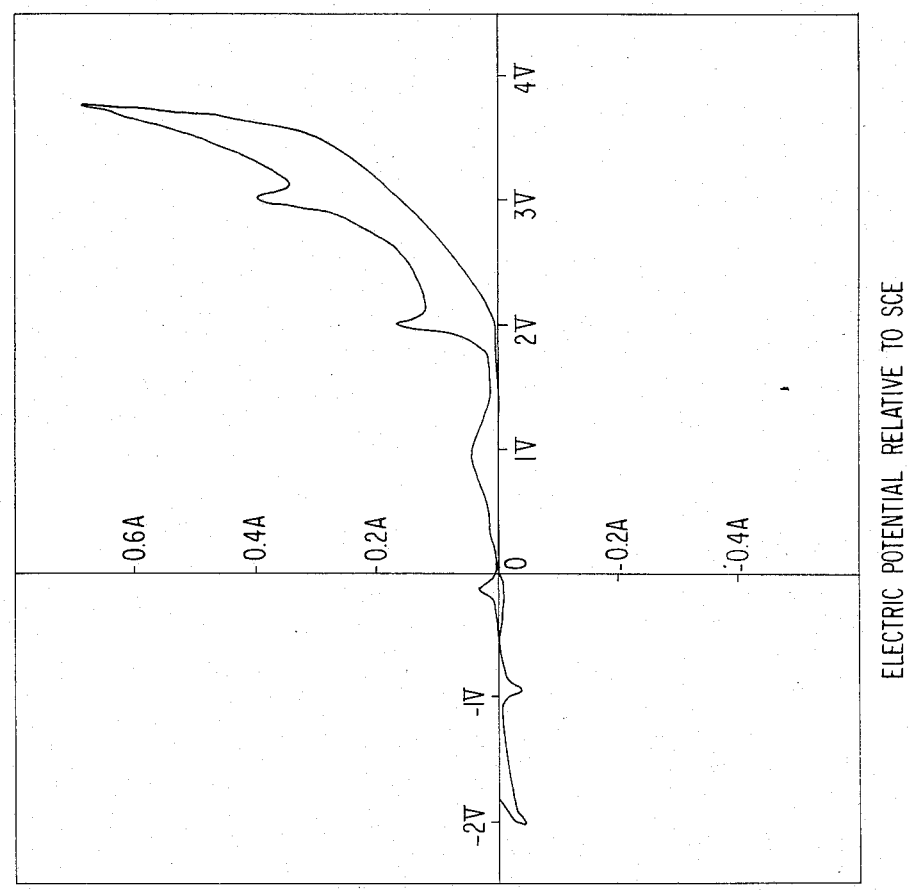
FIG. 15 is a cyclic voltamogram in the electrolytic oxidation of aniline.

The cyclic voltamogram in the electro-oxidation of aniline is shown in FIG. 15.

Figure 16:
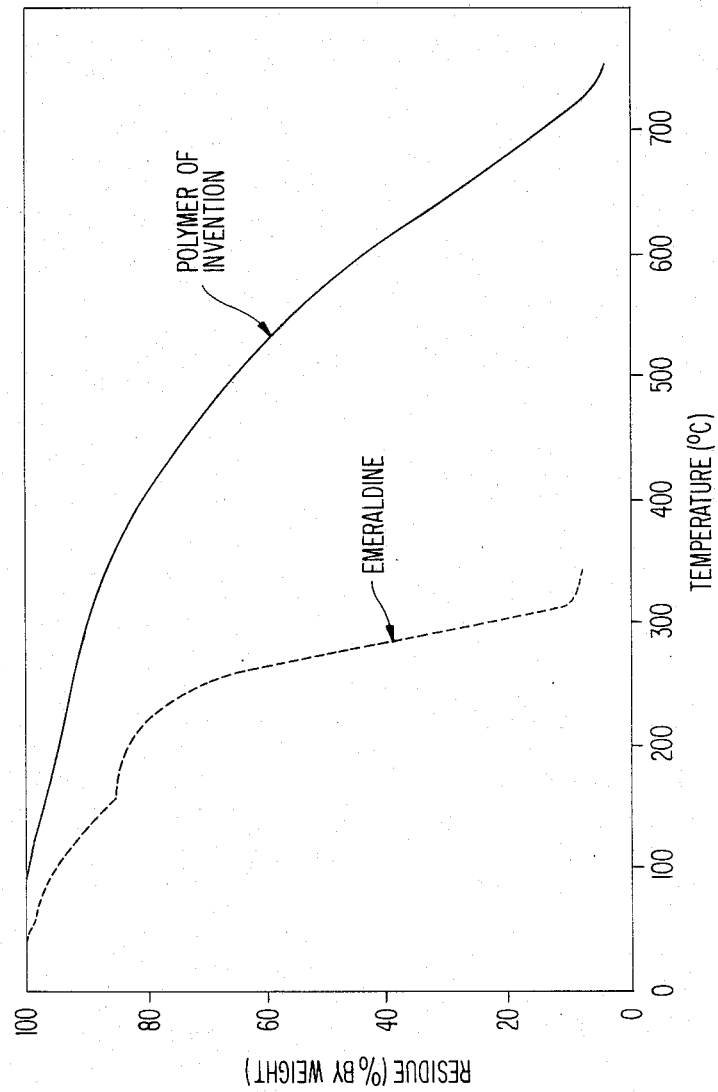
FIG. 16 is a graph showing ratios of weight residue of the polymer of this invention and emeraldine after heating.

Further, the above-described polymer of this invention and emeraldine were subjected to thermogravimetric analysis in air. The results obtained are shown in FIG. 16. The temperature increasing rate in the test was 10° C./minute.

Then, an about 120 mg portion of the polymer obtained above was pulverized in an agate mortar. The resulting polymer powder was compression molded under pressure of 6000 kg/cm$^2$ in a compression molder designed for the preparation of a tablet for the measurement by an infrared spectrophotometer to produce a disk of 13 mm diameter. With four copper foils about 1 mm in width applied fast on the four corners of the disk with silver paste or graphite paste, the disk was tested in the air for electroconductivity by the van der Pauw method, and the electroconductivity was found to be 4.1 S/cm. This molded polymer showed substantially the same level of electroconductivity when measured under a vacuum of $10^{-2}$ Torr. When this disk was allowed to stand in the air for four months, the electroconductivity was not substantially altered.

(3) Infrared absorption spectrum of polymer

Figure 12:
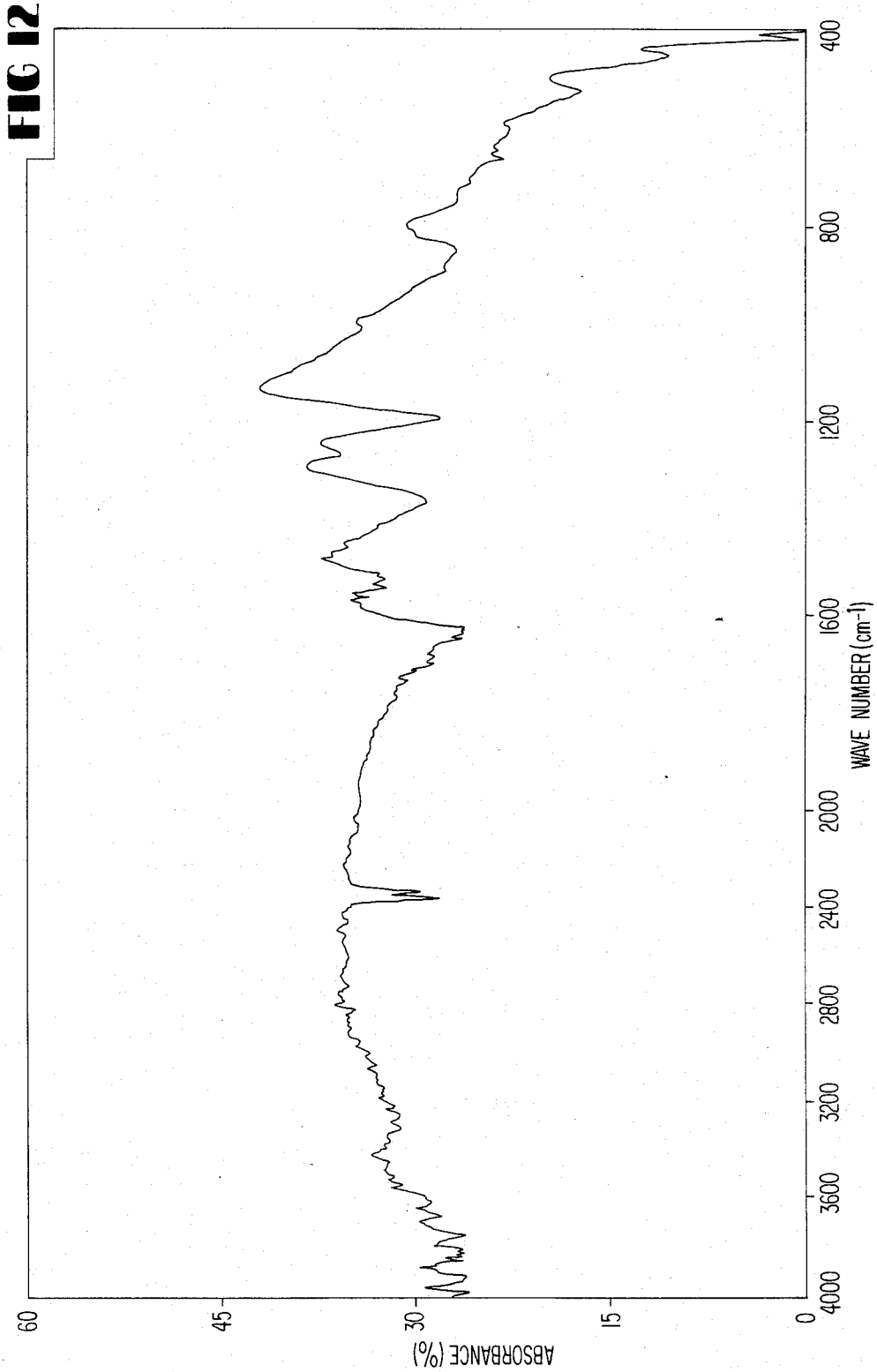
FIG. 12 is an infrared absorption spectrum of an electroconductive organic polymer of the present invention.
Figure 13:
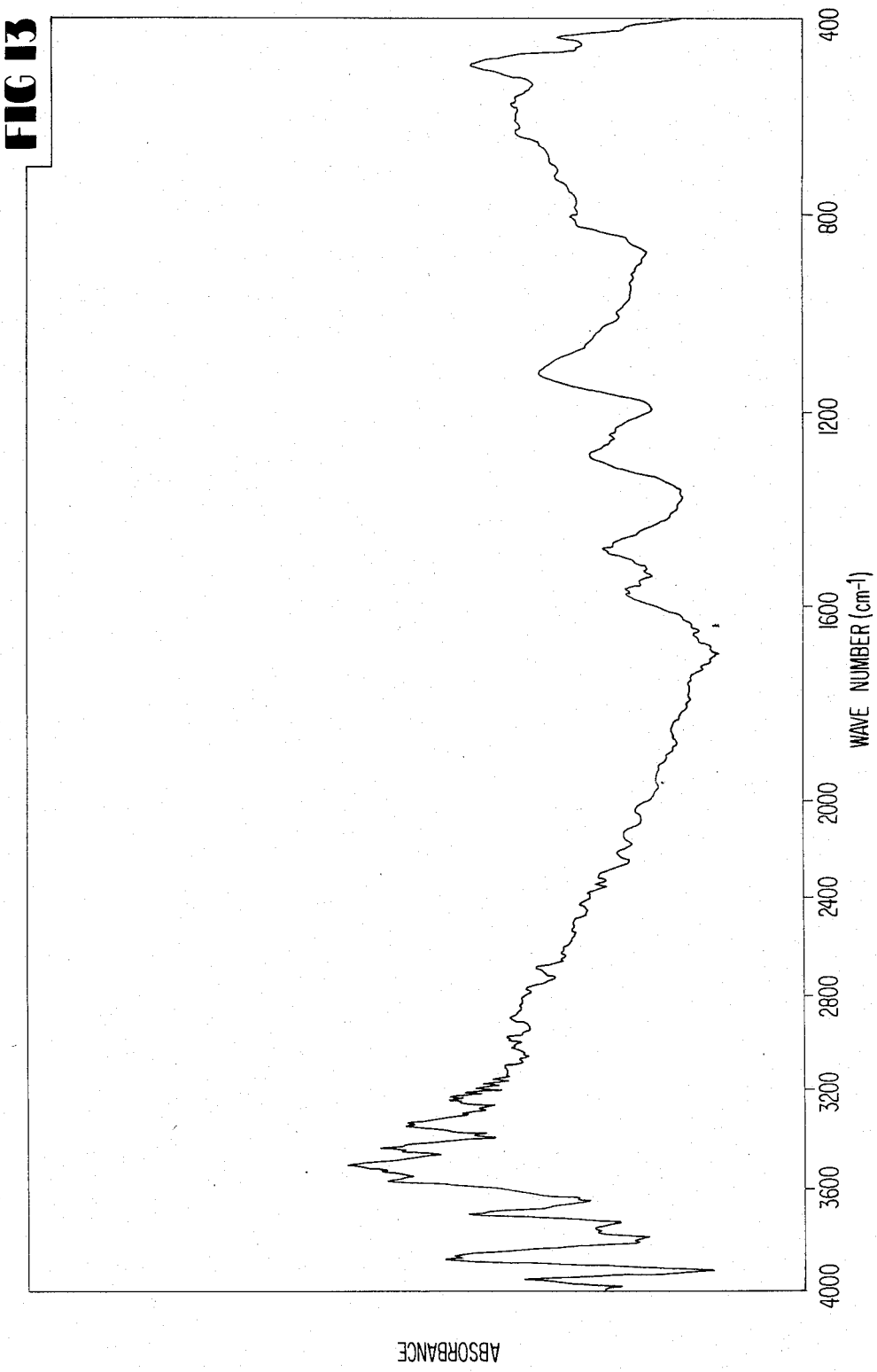
FIG. 13 and FIG. 14 are infrared absorption spectra of emeraldine and aniline black, respectively.
Figure 14:
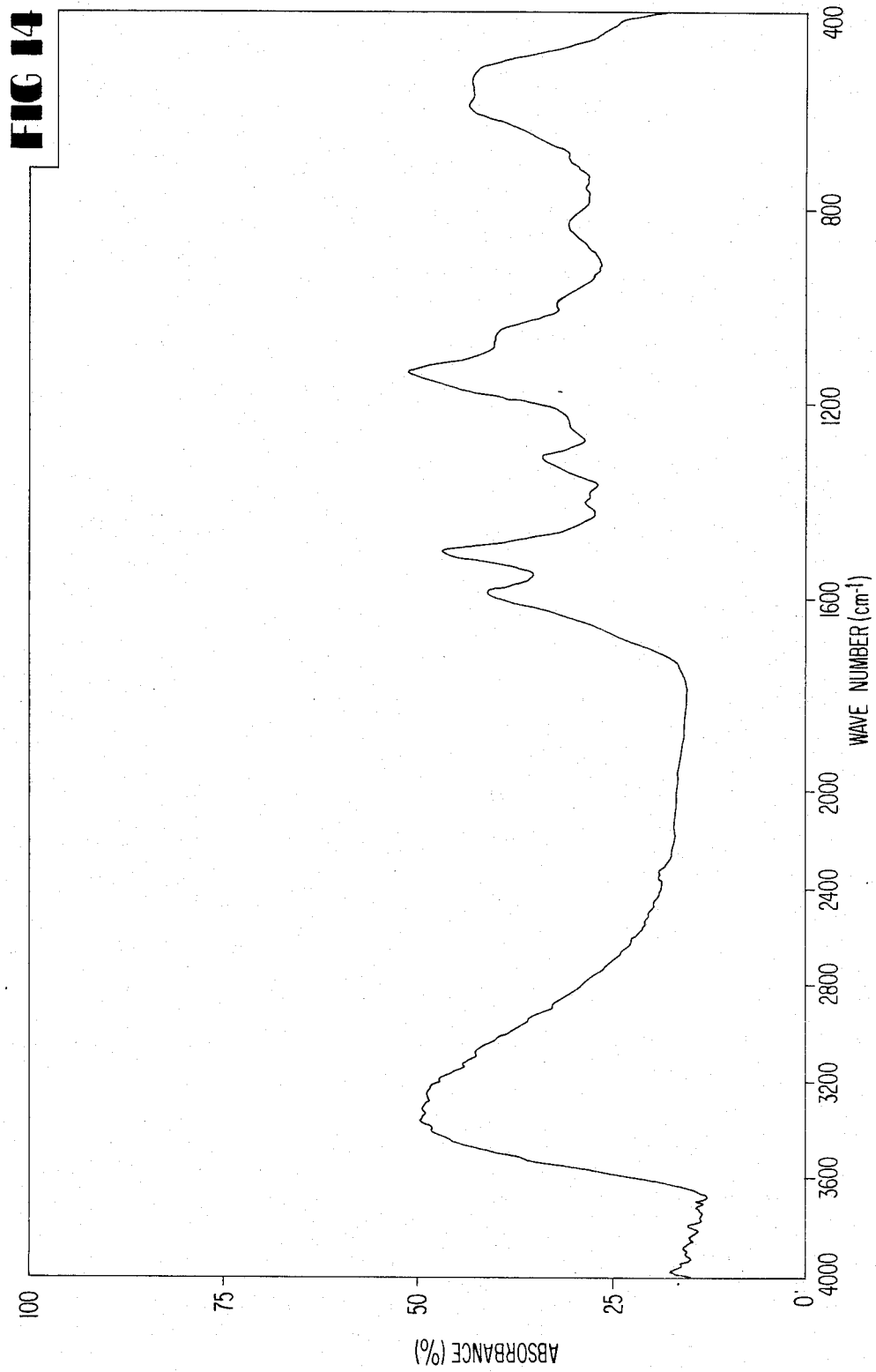

The infrared absorption spectrum of the polymer produced above in shown in FIG. 12. For comparison, the infrared absorption spectra of emeraldine and Diamond black are shown in FIG. 13 and FIG. 14, respectively. The emeraldine was prepared by the method described in D. M. Mohilner et al. (D. M. Mohilner et al., J. Am. Chem. Soc., Vol. 84, p. 3618 (1962)).

The infrared absorption spectrum of the polymer of this invention is similar to that of emeraldine and, at the same time, differs widely in some respects. For example, in the absorption spectrum of emeraldine, clear absorption by the deformation vibration outside the C—H plane due to the mono-substituted benzene is observed at 690 cm$^{-1}$ and 740 cm$^{-1}$. In the absorption spectrum of the polymer of this invention, however, this absorption is not substantially observed and, instead, strong absorption at 800 cm$^{-1}$ indicating the presence of para-substituted benzene is observed. This is because the absorption due to the mono-substituted benzene at the terminal of molecule appears relatively strongly in the emeraldine which is a low molecular weight compound, whereas the absorption due to the para-substituted benzene forming a high molecular chain appears relatively strongly in the polymer of this invention which is a high molecular weight compound. In contrast, the infrared absorption spectrum of aniline black is markedly different from both the infrared absorption spectra of the polymer of this invention and the emeraldine. The difference is apparent in the absorption of large width in the neighborhood of 3200 to 3400 cm$^{-1}$, the absorption apparently due to a quinolic carbonyl group at 1680 cm$^{-1}$, the region of C—N stretching vibration at 1200 to 1300 cm$^{-1}$, and the region below 600 cm$^{-1}$.

The assignment of the infrared absorption spectrum of the polymer of the present invention is as shown below: 1610 cm$^{-1}$ (C=N stretching vibration at shoulder), 1570 and 1480 cm$^{-1}$ (C—C stretching vibration in benzene ring), 1300 and 1240 cm$^{-1}$ (C—N stretching vibration), 1120 cm$^{-1}$ (absorption ascribable to dopant; absorption generated at substantially the same position without reference to the kind of dopant), 800 cm$^{-1}$ (deformation vibration outside C—H plane of para-substituted benzene), and 740 and 690 cm$^{-1}$ (deformation vibration outside C—H plane of monosubstituted benzene).

Figure 17:
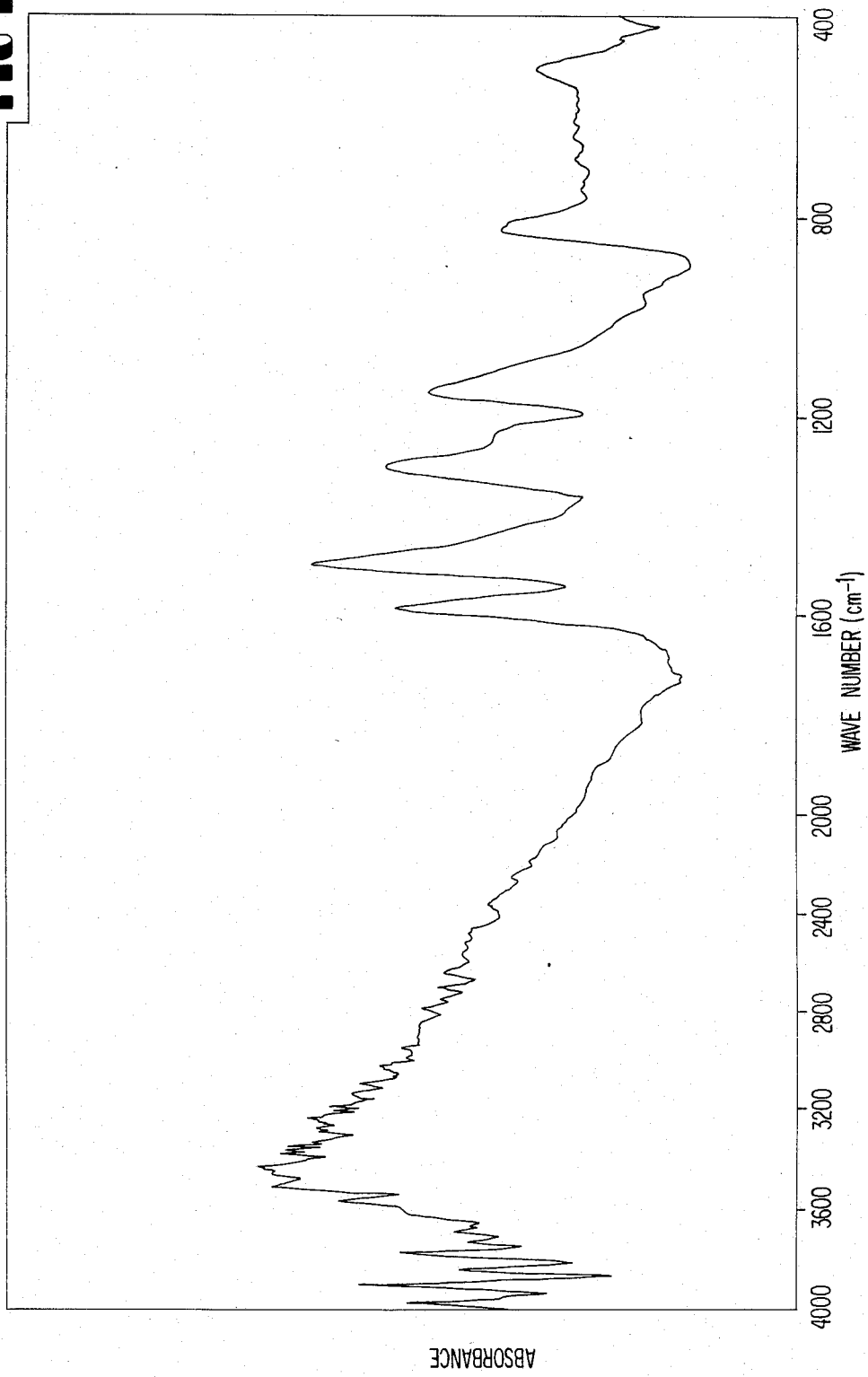
FIG. 17 is an infrared absorption spectrum of a polymer obtained by compensating the polymer of this invention with ammonia.
Figure 18:
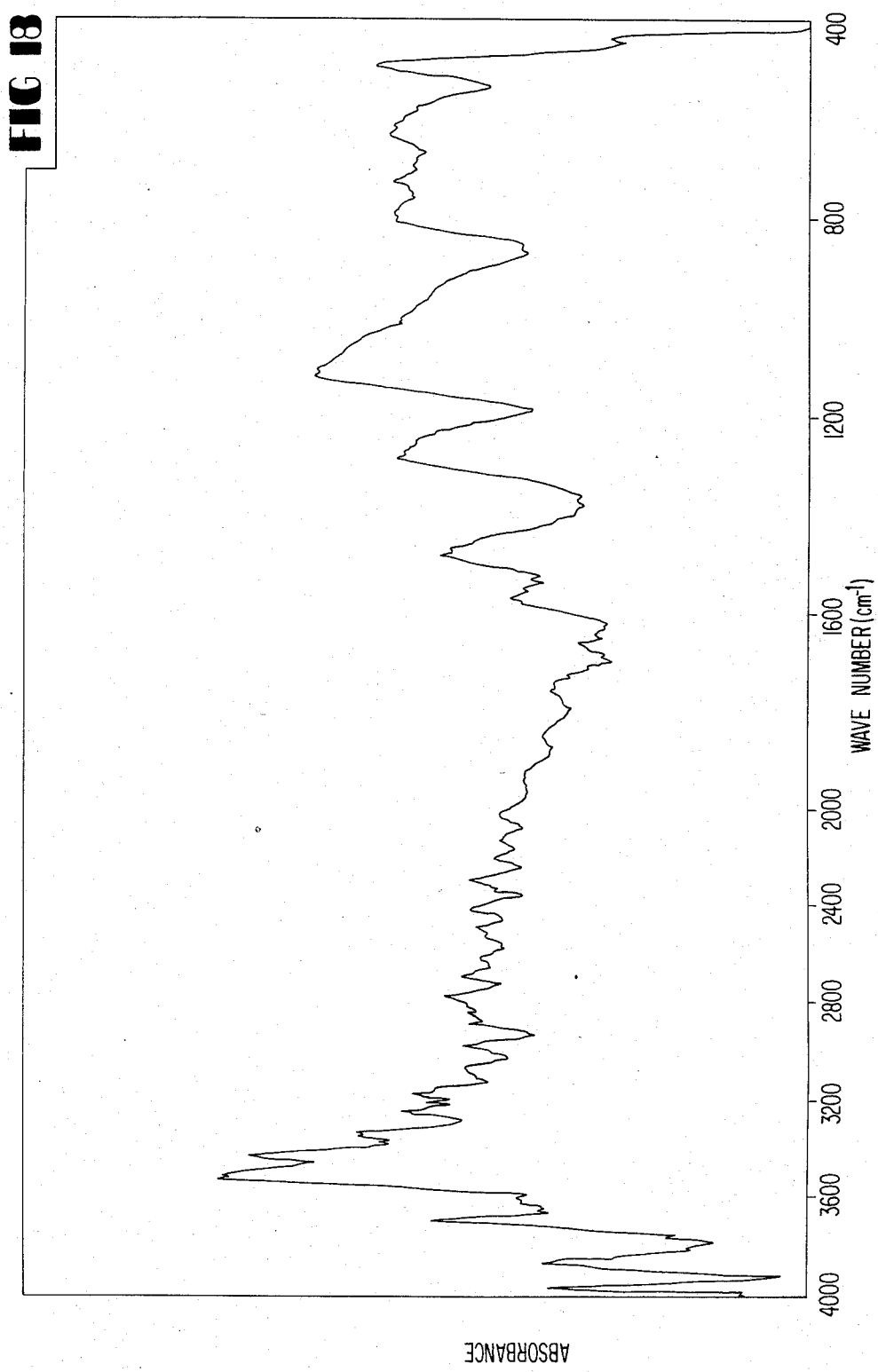
FIG. 18 is an infrared absorption spectrum of the polymer obtained by again doping the polymer shown in FIG. 17 with hydrochloric acid.

The infrared absorption spectrum of the polymer obtained by compensating the above-described polymer with ammonia is shown in FIG. 17 and that of the polymer obtained by again doping the polymer of FIG. 17 with 5N hydrochloric acid is shown in FIG. 18. The spectrum of the polymer obtained by repeated doping is virtually identical with the spectrum of the initial polymer shown in FIG. 12. The electroconductivity of the polymer obtained by repeated doping is the same before the compensation with ammonia. The variation of the electroconductivity was 4.1 S/cm before the compensation, 2.3×10$^{-8}$ S/cm after the compensation, and 1.21 S/cm after the repeated doping. The data clearly indicate that the polymer of the present invention is doped with the protonic acid used during the oxidative polymerization.

(4) Chemical structure of polymer

The elementary analysis of the electroconductive polymer of this invention produced as described above are shown below. The results obtained similarly with respect to the polymer chemically compensated with ammonia are also shown.

| (a) Polymer containing hydrochloric acid as dopant $C_{12}H_8N_2(HC)_{1.5}$ (repeating unit) | | |
|---|---|---|
| | Theoretical values | Measured values |
| C | 61.36 | 60.86 |
| H | 4.08 | 4.18 |
| N | 11.92 | 11.61 |
| C | 22.64 | 22.15 |

The amount of hydrochloric acid indicated in the theoretical formula was calculated based on the actually found amount of chlorine in the polymer.

| (b) Compensated polymer $C_{12}H_8N_2$ (repeating unit) | | |
|---|---|---|
| | Theoretical values | Measured values |
| C | 79.98 | 79.54 |
| H | 4.48 | 4.88 |
| N | 15.54 | 15.02 |

EXAMPLE 8 (RUN NOS. 2 TO 7)

The electro-oxidation of aniline was carried out according to the procedure as described in Example 7, except that each of the acids indicated in Table below was used as a protonic acid in an equimolar amount relative to aniline in place of hydrochloric acid. The logarithmic viscosity number of the polymer obtained by using sulfuric acid as a protonic acid was 0.36.

EXAMPLE 9 (RUN NOS. 8 AND 9)

An electroconductive organic polymer of this invention was obtained according to the procedure as described in Example 7, except that the aniline concentration in the aniline solution was varied and the amount of hydrochloric acid was varied proportionally so as to be an equimolar amount relative to aniline. The electroconductivity of the resulting polymer is shown in Table below.

COMPARATIVE EXPERIMENT (RUN NOS. 12 AND 13)

The electro-oxidation was carried out according to the procedure as described in Example 7, except that the aniline concentration in the aniline solution was changed to 0.1% by weight and, as an acid, hydrochloric acid or sulfuric acid was used as an aqueous solution thereof having a concentration of 1 mol/liter. The electroconductivity of the resulting polymer is shown in Table below. These polymers were soluble in concentrated sulfuric acid and partially soluble in N-methyl-2-pyrrolidone.

EXAMPLE 10 (RUN NOS. 14 TO 16)

The electro-oxidation was carried out using an aniline solution having the composition as described in Run No. 1 of Example 7 at the initial electrode potential shown in Table below.

COMPARATIVE EXPERIMENT 2 (RUN NO. 17)

Following the procedure as described in Example 9, the electro-oxidation was carried out using an aniline solution having the composition as described in Example 7 at the initial electrode potential of +1 V relative to SCE. The results are shown in Table below. The resulting polymer was soluble in each of concentrated sulfuric acid and N-methyl-2-pyrrolidone.

EXAMPLE 11 (RUN NOS. 18 TO 22)

The electro-oxidation was carried out according to the procedure as described in Example 7, except that various aniline concentrations were used and, at the same time, the organic solvent indicated in the Table was used. The electroconductivity of the resulting polymer is shown in Table below. The logarithmic viscosity number of the polymer obtained by using methanol as a solvent was found to be 0.33.

EXAMPLE 12 (RUN NO. 22)

The electro-oxidative polymerization was carried out using an aniline solution having an aniline concentration of 10% by weight and containing hydrochloric acid in an equimolar amount relative to aniline and additionally containing 0.5% by weight of tetrabutyl ammonium perchlorate as a supporting electrolyte for 30 hours while passing electric current at a fixed current density of 11.1 mA/cm² and at an initial electrode potential of +1.7 V relative to SCE. The aniline polymer formed on the anode was separated, and worked-up in the same manner as described in Example 7 to obtain an electroconductive polymer. The resulting polymer had an electroconductivity of 4.4 S/cm.

EXAMPLE 13 (RUN NOS. 23 TO 26)

The electro-oxidation was carried out using an aniline solution having an aniline concentration of 25% by weight and containing hydrochloric acid in an equimolar amount relative to aniline while passing electric current at a fixed current density shown in Table below. The electroconductivity of the resulting polymer is shown in Table below.

While the invention has been described in detail and with reference to specific embodiments thereof, it will be apparent to one skilled in the art that various changes and modifications can be made therein without departing from the spirit and scope thereof.

What is claimed is:

1. An electroconductive organic polymer containing an electron acceptor as a dopant, and having electroconductivity of not less than $10^{-6}$ S/cm, consisting essentially of a linear polymer having as a main repeating unit thereof a quinonediimine structure represented by formula (III)

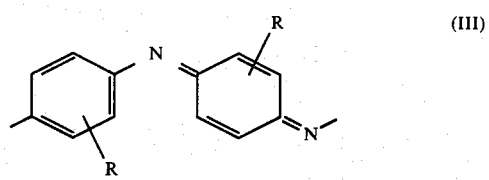

(III)

wherein R represents a hydrogen atom, a methyl group, or an ethyl group
wherein the polymer has a logarithmic viscosity number of at least 0.10 as determined in 97% sulfuric acid at a concentration of 0.5 g/dl of said polymer at 30° C.

2. A method for producing an electroconductive organic polymer as defined in claim 1, which comprises oxidative polymerization of aniline, methylaniline or ethylaniline or a water-soluble salt thereof with an oxidizing agent in a reaction medium containing a protonic acid

TABLE

| Run No. | Aniline Concentration (wt %) | Solvent | Protonic Acid Compound | Protonic Acid Concentration | Current Density (mA/cm²)[3] | Electrode Potential Relative to SCE (V)[4] | Duration of Current Passage (hrs) | Electroconductivity (S/cm) |
|---|---|---|---|---|---|---|---|---|
| 1 | 10 | Water | Hydrochloric acid | Equimolar Amount[1] | 5 | 1.8 | 8 | 4.1 |
| 2 | 10 | Water | Sulfuric acid | | 5 | 1.6 | 8 | 2.1 |
| 3 | 10 | Water | Nitric acid | | 5 | 1.5 | 8 | 4.5 |
| 4 | 10 | Water | Perchloric acid | | 5 | 1.2 | 8 | 16.0 |
| 5 | 10 | Water | Hydrobromic acid | | 5 | 1.2 | 8 | 2.9 |
| 6 | 10 | Water | HBF$_4$ | | 5 | 1.2 | 8 | 1.9 |
| 7 | 10 | Water | HPF$_6$ | | 5 | 1.2 | 8 | 3.6 |
| 8 | 5 | Water | Hydrochloric acid | Equimolar Amount[1] | 5 | 2.4 | 17 | 1.6 |
| 9 | 25 | Water | Hydrochloric acid | Equimolar Amount[1] | 5 | 1.8 | 2 | 2.4 |
| 10 | 10 | Water | Hydrochloric acid | 1 M | 5 | 1.1 | 6 | 36 |
| 11 | 6 | Water | Sulfuric acid | | 5 | 1.2 | 6 | 2.1 |
| 12[6] | 0.1 | Water | Hydrochloric acid | 1 M | 25 | 2.1 | 48 | [5] |
| 13[6] | 0.1 | Water | Sulfuric acid | | 25 | 2.3 | 48 | [5] |
| 14 | 10 | Water | Hydrochloric acid | " | 30 | 2 | 5 | 1.7 |
| 15 | 10 | Water | Hydrochloric acid | | 100 | 4 | 2 | 9.0 |
| 16 | 10 | Water | Hydrochloric acid | | 550 | 10 | 1 | 10.0 |
| 17[6] | 10 | Water | Hydrochloric acid | | 2.3 | 1 | 48 | [5] |
| 18 | 2 | Methanol | Hydrochloric acid | | 5 | 1.2 | 16 | 0.40 |
| 19 | 2 | Acetonitrile | Hydrochloric acid | | 5 | 15 | 20 | 0.13 |
| 20 | 2 | Methyl ethyl ketone | Hydrochloric acid | Equimolar Amount[1] | 5 | 30 | 24 | 0.25 |
| 21 | 2 | Dimethyl formamide | Hydrochloric acid | | 5 | 28 | 38 | 0.84 |
| 22[2] | 10 | Water | Hydrochloric acid | | 11.1 | 1.7 | 30 | 4.4 |
| 23 | 25 | Water | Hydrochloric acid | | 1 | 1.9 | 5 | 1.2 |
| 24 | 25 | Water | Hydrochloric acid | | 1.7 | 2.0 | 17 | 3.2 |
| 25 | 25 | Water | Hydrochloric acid | | 10 | 2.5 | 3 | 4.2 |
| 26 | 25 | Water | Hydrochloric acid | | 20 | 2.6 | 1 | 4.0 |

(Note)
[1]Equimolar amount relative to aniline.
[2]Tetrabutyl ammonium perchlorate contained as supporting electrolyte.
[3]In Run Nos. 1 to 13 and Run Nos. 18 to 26, the values of electrode potential indicated are those measured at a fixed current density and, therefore, the corresponding values of electrode potential represent those of initial electrode potential.
[4]In Run Nos. 14 to 17, the values of current density indicated are those measured at a fixed current density and, therefore, the corresponding values of current density represent those of initial current density.
[5]The yield was too low to determined.
[6]Comparative Experiment wherein said oxidizing agent is potassium dichromate, and wherein the molar ratio of protonic acid/potassium dichromate in said reaction medium containing said oxidizing agent is not less than 1.2/1.

3. A method according to claim 2, wherein said protonic acid is sulfuric acid.

4. The method according to claim 2, wherein said methylaniline is o-methylaniline or m-methylaniline, and said ethylaniline is o-ethylaniline or m-ethylaniline.

5. A method according to claim 3, wherein the molar ratio is not more than about 50/1.

6. An electroconductive organic polymer according to claim 1, wherein the 97% sulfuric acid 0.5 g/dl solution of the polymer possesses a logarithmic viscosity number of from 0.1 to 1.0.

7. An electroconductive organic polymer according to claim 1, wherein the 97% sulfuric acid 0.5 g/dl solution of the polymer possesses a logarithmic viscosity number of from 0.2 to 0.6.

8. An electroconductive organic polymer according to claim 1, wherein said polymer has an electroconductivity higher than $10^{-3}$ S/cm.

* * * * *